United States Patent
Matsumura et al.

(10) Patent No.: US 9,972,884 B2
(45) Date of Patent: May 15, 2018

(54) RFID TAG

(71) Applicants: FUJITSU LIMITED, Kawasaki-shi, Kanagawa (JP); FUJITSU FRONTECH LIMITED, Inagi-shi, Tokyo (JP)

(72) Inventors: Takayoshi Matsumura, Yokohama (JP); Yoshiyasu Sugimura, Inagi (JP); Hideo Miyazawa, Inagi (JP); Tatsuro Tsuneno, Inagi (JP)

(73) Assignees: FUJITSU LIMITED, Kawasaki (JP); FUJITSU FRONTECH LIMITED, Tokyo (JP)

( * ) Notice: Subject to any disclaimer, the term of this patent is extended or adjusted under 35 U.S.C. 154(b) by 0 days. days.

(21) Appl. No.: 15/222,163

(22) Filed: Jul. 28, 2016

(65) Prior Publication Data
US 2017/0062904 A1   Mar. 2, 2017

(30) Foreign Application Priority Data
Aug. 27, 2015   (JP) .................... 2015-167963

(51) Int. Cl.
*H01Q 1/22*  (2006.01)
*H01Q 1/38*  (2006.01)
(Continued)

(52) U.S. Cl.
CPC ....... *H01Q 1/2225* (2013.01); *G06K 19/0723* (2013.01); *G06K 19/07754* (2013.01); *H01Q 1/38* (2013.01); *H01Q 1/50* (2013.01)

(58) Field of Classification Search
CPC .......... H01Q 1/2225; H01Q 1/38; H01Q 1/50; G06K 19/0723
See application file for complete search history.

(56) References Cited

U.S. PATENT DOCUMENTS 6,666,380 B1   12/2003  Suzuya
7,789,316 B2 *  9/2010  Kobayashi ........... G06K 19/027
                                                        235/492
(Continued)

FOREIGN PATENT DOCUMENTS

EP   1947917 A2   7/2008
JP   10-173301 A  6/1998
(Continued)

OTHER PUBLICATIONS

European Search Report application No. 16180325.9 dated Feb. 1, 2017.

*Primary Examiner* — Tho G Phan
(74) *Attorney, Agent, or Firm* — Squire Patton Boggs (US) LLP

(57) ABSTRACT

A disclosed RFID tag includes a substrate; a chip bonded to the substrate with an adhesive, and including a first connection terminal on a first surface, the first surface being on a side bonded to the substrate; a first antenna wiring formed on the substrate, and electrically coupled to the first connection terminal; and an adhesive layer formed of the adhesive, and including a base portion and a filet portion, the base portion being in an area of the substrate opposed to the first surface of the chip, the filet portion being in an area of the substrate surrounding the chip. The first antenna wiring is electrically coupled to the first connection terminal via a plurality of paths at an outer edge of the filet portion of the adhesive layer.

12 Claims, 22 Drawing Sheets

(51) Int. Cl.
*G06K 19/07* (2006.01)
*G06K 19/077* (2006.01)
*H01Q 1/50* (2006.01)

(56) References Cited

U.S. PATENT DOCUMENTS

| | | | | |
|---|---|---|---|---|
| 8,049,669 | B2 * | 11/2011 | Yamazaki | G06K 19/07728 343/700 MS |
| 8,308,071 | B2 * | 11/2012 | Takeuchi | G06K 19/07724 235/492 |
| 9,391,369 | B2 * | 7/2016 | Miura | G06K 7/10316 |
| 2006/0057763 | A1 * | 3/2006 | Teo | H01L 24/83 438/64 |
| 2007/0272437 | A1 | 11/2007 | Kondo | |
| 2008/0074793 | A1 * | 3/2008 | Sakama | G11B 23/0042 360/244.1 |
| 2009/0236127 | A1 | 9/2009 | Kobae | |

FOREIGN PATENT DOCUMENTS

| | | |
|---|---|---|
| JP | 2000-200328 A | 7/2000 |
| JP | 2006-127254 A | 5/2006 |
| JP | 2007-317842 A | 12/2007 |

* cited by examiner

US 9,972,884 B2

RFID TAG

CROSS-REFERENCE TO RELATED APPLICATIONS

This present application is based upon and claims the benefit of priority of the prior Japanese Patent Application No. 2015-167963, filed on Aug. 27, 2015, the entire contents of which are incorporated herein by reference.

FIELD

The present disclosure is related to an RFID (Radio Frequency Identification) tag.

BACKGROUND

Japanese Laid-open Patent Publication No. 2006-127254 (referred to as "254 JP Patent Publication", hereinafter) discloses an IC (Integrated Circuit) card of non-contact type in which a plurality of lead parts are provided on a substrate to electrically couple a bump of an IC chip to an antenna portion.

However, according to a configuration disclosed in 254 JP Patent Publication, an adhesive layer of an adhesive extends only under the IC chip to bond the IC chip to the substrate, which increases a probability that the lead parts come into contact with an edge of the IC chip and are cut by the edge when the IC card of non-contact type is bent to be in a concave form.

SUMMARY

According to one aspect, an RFID tag is provided, comprising: a substrate; a chip bonded to the substrate with an adhesive, and including a first connection terminal on a first surface, the first surface being on a side bonded to the substrate; a first antenna wiring formed on the substrate, and electrically coupled to the first connection terminal; and an adhesive layer formed of the adhesive, and including a base portion and a filet portion, the base portion being in an area of the substrate opposed to the first surface of the chip, the filet portion being in an area of the substrate surrounding the chip, wherein the first antenna wiring is electrically coupled to the first connection terminal via a plurality of paths at an outer edge of the filet portion of the adhesive layer.

The object and advantages of the embodiment will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

In the following, embodiments will be described with reference to the accompanying drawings.

Figure 1:
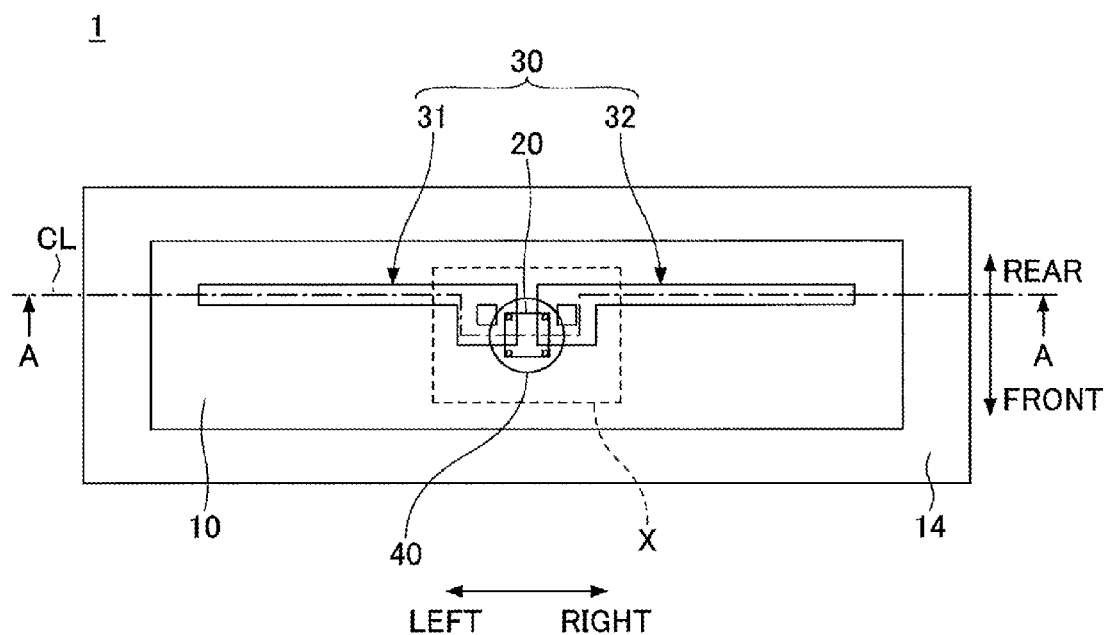
FIG. 1 is a top view schematically illustrating a configuration of an RFID tag according to a first embodiment.
Figure 2:
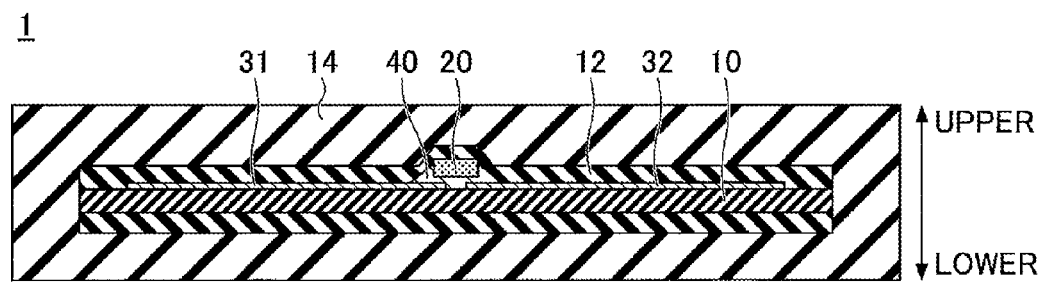
FIG. 2 is a diagram schematically illustrating a cross-sectional view along a line A-A in FIG. 1.

FIG. 1 is a top view schematically illustrating a configuration of an RFID tag according to a first embodiment. FIG. 2 is a diagram schematically illustrating a cross-sectional view along a line A-A in FIG. 1. In FIG. 1, an RFID tag 1 is illustrated transparently such that the inside of the RFID tag 1 can be seen.

In the following, with respect to a left and right direction, an explanation is made assuming that a direction of a longer side (a long-side direction) of a substrate 10 corresponds to the left and right direction, as illustrated in FIG. 1. Further, an explanation is made assuming that a shorter side (a short-side direction) of the substrate 10 corresponds to a front and rear direction. Further, with respect to a upper and lower direction, an explanation is made assuming that an upper side corresponds to a side of the substrate 10 on which an IC chip 20 is provided, as illustrated in FIG. 2. However, an orientation of the installation of the RFID tag 1 is arbitrary.

The RFID tag 1 can be utilized for management of an object, for example. The object to be managed is arbitrary. For example, the object to be managed is one of uniforms used for an employee in overnight accommodations or entertainment facilities, bed sheets, pillow covers, etc., used in the overnight accommodations.

The RFID tag 1 includes the substrate 10, the IC chip 20, and an antenna portion 30.

The substrate 10 forms a base for the antenna portion 30, and is flexible. The substrate 10 may be formed of PET (polyethylene terephthalate) or PEN (polyethylene naphthalate), for example. The substrate 10 has upper and lower surfaces covered with protective layers 12 and are also protected by a sheathing portion 14 in a state in which the IC chip 20 and the antenna portion 30 are installed. The protective layers 12 are formed by a laminating process, for example. The sheathing portion 14 is formed of a flexible material such as a rubber, for example.

The IC chip 20 is bonded to the substrate 10 with an adhesive. In other words, the IC chip 20 is bonded to the substrate 10 via an adhesive layer (see FIG. 3). The IC chip 20 is operated with electromagnetic waves received by the antenna portion 30. The IC chip 20 is given unique ID (Identification) information which is utilized for the management, etc., of the object.

The antenna portion 30 forms a dipole antenna, for example. The antenna portion 30 is electrically coupled to the IC chip 20. The antenna portion 30 includes an antenna wiring 31 on a left side and an antenna wiring 32 on a right side. It is preferred that the antenna wirings 31 and 32 have the same length in the left and right direction. The antenna wirings 31 and 32 are formed in a form of a conducive pattern on the surface (i.e., the upper surface) of the substrate 10.

Figure 3:
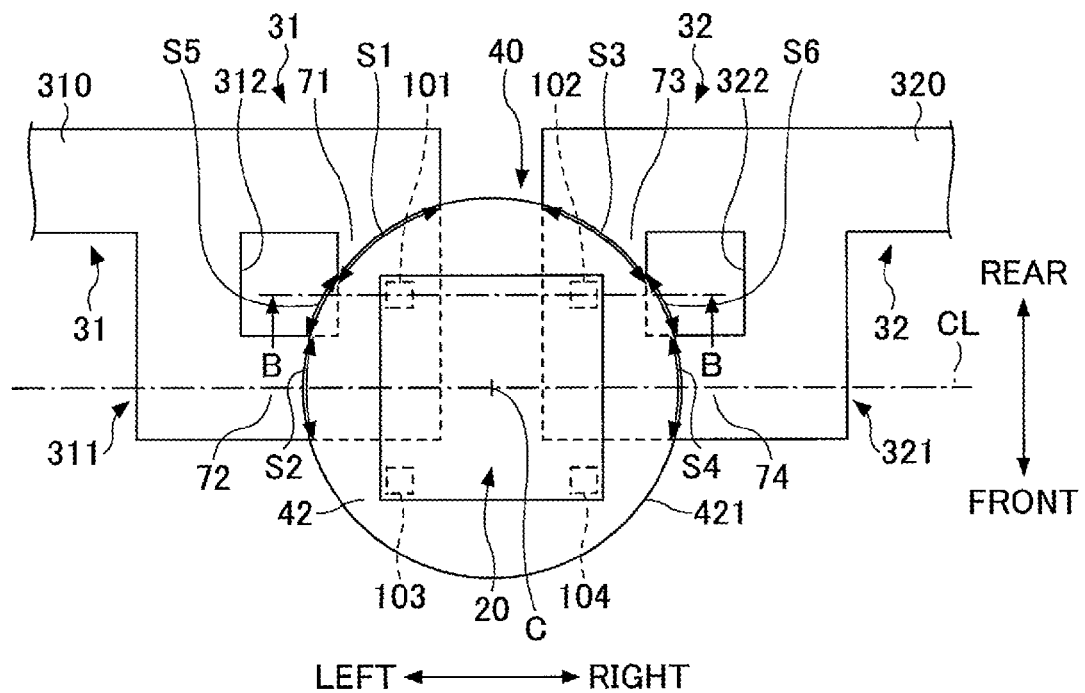
FIG. 3 is a magnified view of a portion X in FIG. 1.
Figure 4:
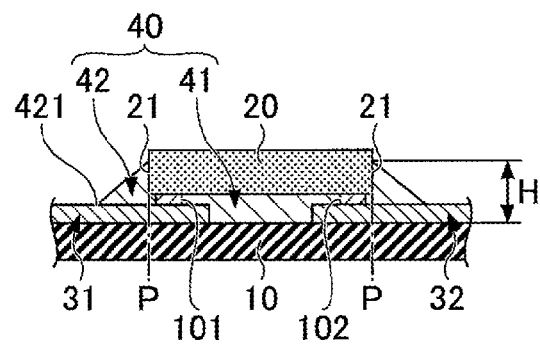
FIG. 4 is a diagram illustrating a cross-sectional view along a line B-B in FIG. 3.

Next, with reference to FIG. 3 and FIG. 4, the antenna portion 30 and the adhesive layer 40 of the RFID tag 1 are explained.

FIG. 3 is a magnified view of a portion X in FIG. 1. FIG. 4 is a diagram illustrating a cross-sectional view along a line B-B in FIG. 3. In FIG. 3, a portion located below the IC chip 20 or the adhesive layer 40 is illustrated with dotted lines. Further, in FIG. 3 an illustration of the substrate 10 is omitted. Further, in FIG. 4, an illustration of the protective layers 12 and the sheathing portion 14 is omitted.

The RFID tag 1 further includes the adhesive layer 40, as illustrated in FIG. 3 and FIG. 4. The adhesive layer 40 is formed of the adhesive that bonds the IC chip 20 to the substrate 10, as described above. The adhesive is arbitrary, and an ACP (Anisotropic Conductive Paste), etc., may be used, for example. The adhesive layer 40 is formed on the surface (i.e., the upper surface) of the substrate 10. The adhesive layer 40 is formed on the antenna portion 30 in a region on the surface of the substrate 10 in which the antenna portion 30 is provided.

The IC chip 20 has a bump 101 (an example of a first connection terminal or a second connection terminal) and a bump 102 (an example of a second connection terminal or a first connection terminal) on a first surface thereof on a side bonded to the substrate 10, as illustrated in FIG. 3 and FIG. 4. Further, the IC chip 20 may have dummy bumps 103 and 104 on the first surface thereof on a side bonded to the substrate 10, as illustrated in FIG. 3 and FIG. 4. The dummy bumps 103 and 104 may be formed to increase stability of the IC chip 20 on the substrate 10.

It is noted that, in the example illustrated in FIG. 3, the IC chip 20 is registered with respect to the substrate 10 such that a center C of the IC chip 20 is on a center line CL (i.e., a center line extending in the left and right direction and passing through the center in the front and rear direction) of the substrate 10. Further, the IC chip 20 is registered with respect to the substrate 10 such that the center C of the IC chip 20 is located at the center of the substrate 10 in the left and right direction. In other words, the center C of the IC chip 20 corresponds to the center of the substrate 10. However, as an fourth embodiment described hereinafter, the center C of the IC chip 20 may be offset with respect to the center of the substrate 10.

The adhesive layer 40 includes a base portion 41 (see FIG. 4) and a filet portion 42. The base portion 41 and the filet portion 42 are formed integrally. For example, the filet portion 42 can be formed by adjusting an amount of the adhesive applied on the substrate 10.

The base portion 41 extends in a bonding region on the substrate 10. The bonding region is below the IC chip 20 (i.e., the region overlapped with the IC chip 20) in a top view. In other words, the base portion 41 extends between the IC chip 20 and the substrate 10 in the upper and lower direction.

The filet portion 42 extends in a peripheral region surrounding the bonding region on the substrate 10. In other words, the filet portion 42 is provided in the peripheral region around the IC chip 20. The filet portion 42 extends from an outer edge (see a position P in FIG. 4) of the base portion 41 to surround the base portion 41. In the following, an outer edge of a filet portion, such as an outer edge 421 of the filet portion 42, is referred to as "a filet edge".

It is preferred that the filet portion 42 has a height H such that the filet portion 42 can bond to a side 21 of the IC chip 20, as illustrated in FIG. 4. With this arrangement, the IC chip 20 can be bonded to the substrate 10 more reliably, with respect to a case where the filet portion 42 is not bonded to the side 21 of the IC chip 20. In other words, the bonding strength of the IC chip 20 to the substrate 10 can be increased.

The antenna wiring 31 includes an antenna body 310 and a land portion 311.

The antenna body 310 extends straight in the left and right direction with a predetermined width. The antenna body 310 has a right end coupled to the land portion 311 and a left end that forms an open end.

The land portion 311 is formed in an end of the antenna wiring 31 on the side of the bump 101. The land portion 311 has a rectangular form whose sides are substantially longer than the width of the antenna body 310, for example. In the example illustrated in FIG. 3, the land portion 311 is formed such that the width of the antenna body 310 is enlarged in only the front direction. At the land portion 311, the antenna wiring 31 is electrically coupled to the IC chip 20 via the bump 101, as illustrated in FIG. 3 and FIG. 4. In the example illustrated in FIG. 3 and FIG. 4, the land portion 311 is disposed on the left side with respect to the center C of the IC chip 20. In this case, a portion of the land portion 311 on the right side with respect to an aperture 312 (described hereinafter) is formed at the position of the bump 101.

The antenna body 310 of the antenna wiring is electrically coupled to the bump 101 via a plurality of paths formed at a filet edge 421 of the filet portion 42 of the adhesive layer 40. In the example illustrated in FIG. 3, there are two paths, that is to say, a first path 71 and a second path 72. Specifically, a section S1 of the filet edge 421 where the first path 71 passes and a section S2 of the filet edge 421 where the second path 72 passes are separated via a section S5 of the filet edge 421. The section S5 of the filet edge 421 is not on the antenna wiring 31. In the following, electrically coupling the antenna wiring 31 to the bump 101 via a plurality of paths formed at the filet edge 421 in this way is referred to as "multi-path at the filet edge 421". For example, in the example illustrated in FIG. 3 the double-path at the filet edge 421 is implemented.

The first path 71 and the second path 72 extend to the bump 101 below the filet portion 42, respectively, to join into one, as illustrated in FIG. 3.

The first path 71 and the second path 72 are formed by the aperture 312 in the land portion 311, as illustrated in FIG. 3. The aperture 312 is formed in the land portion 311 such that the aperture 312 crosses the filet edge 421. It is noted that crossing the filet edge 421 means a transition from the outer side of the filet edge 421 to the inner side of the filet edge 421. The aperture 312 is formed at the substantially center of the land portion 311.

Similarly, the antenna wiring 32 includes an antenna body 320 and a land portion 321. The antenna body 320 extends straight in the left and right direction with a predetermined width. The antenna body 320 has a left end coupled to the land portion 311 and a right end that forms an open end.

The land portion 321 is formed in an end of the antenna wiring 32 on the side of the bump 102. The land portion 321 has a rectangular form whose sides are substantially longer than the width of the antenna body 320, for example. In the example illustrated in FIG. 3, the land portion 321 is formed such that the width of the antenna body 320 is enlarged in only the front direction. At the land portion 321, the antenna wiring 32 is electrically coupled to the IC chip 20 via the bump 102, as illustrated in FIG. 3 and FIG. 4. In the example illustrated in FIG. 3 and FIG. 4, the land portion 321 is disposed on the right side with respect to the center C of the IC chip 20. In this case, a portion of the land portion 321 on the left side with respect to an aperture 322 (described hereinafter) is formed at the position of the bump 102.

The antenna body 320 of the antenna wiring 32 is electrically coupled to the bump 102 via a plurality of paths formed at a filet edge 421 of the filet portion 42 of the adhesive layer 40. In the example illustrated in FIG. 3, there are two paths, that is to say, a third path 73 and a fourth path 74. Specifically, a section S3 of the filet edge 421 where the third path 73 passes and a section S4 of the filet edge 421 where the fourth path 74 passes are separated via a section S6 of the filet edge 421. The section S6 of the filet edge 421 is not on the antenna wiring 32. In this way, also with respect to the antenna wiring 32, the multi-path at the filet edge 421 is implemented. For example, in the example illustrated in FIG. 3 the double-path at the filet edge 421 is implemented.

The third path 73 and the fourth path 74 extend to the bump 102 below the filet portion 42, respectively, to join into one, as illustrated in FIG. 3.

The third path 73 and the fourth path 74 are formed by an aperture 322 in the land portion 321, as illustrated in FIG. 3. The aperture 322 is formed in the land portion 321 such that the aperture 322 crosses the filet edge 421. In the example illustrated in FIG. 3, the aperture 322 is formed at the substantially center of the land portion 321.

Next, with reference to FIG. 5A through FIG. 8, effects of the embodiment are described.

Figure 7A:
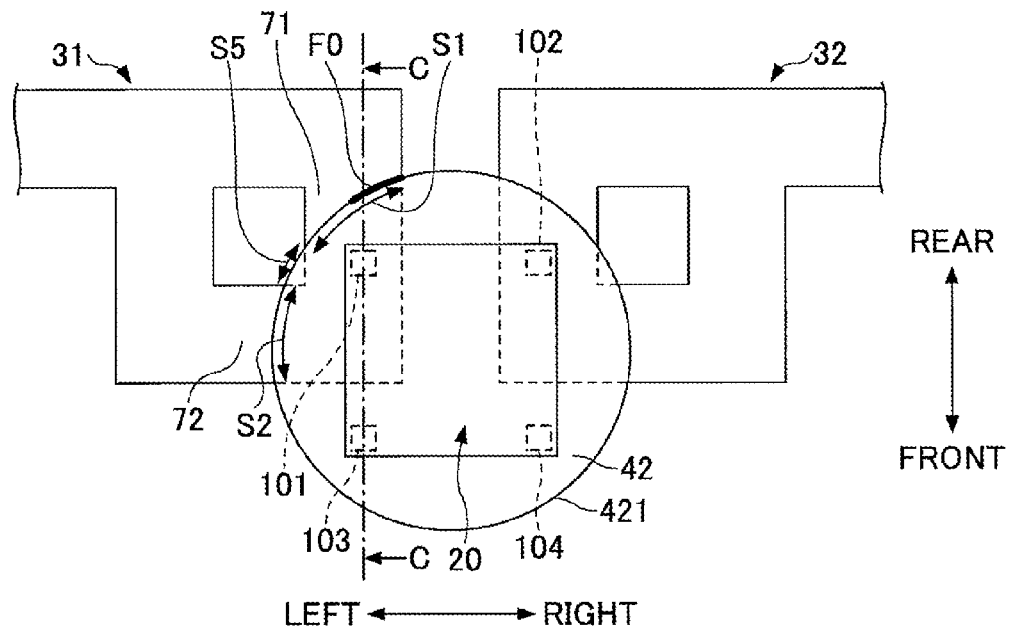
FIG. 7A is a diagram explaining a crack in the first embodiment.
Figure 7B:
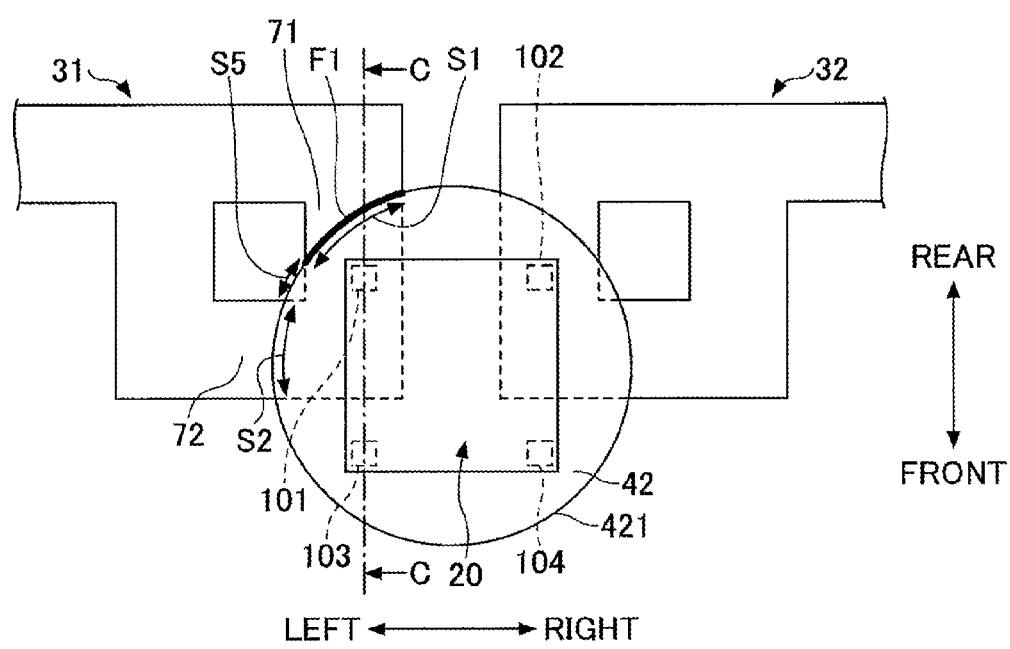
FIG. 7B is a diagram explaining the crack in the first embodiment.
Figure 8:
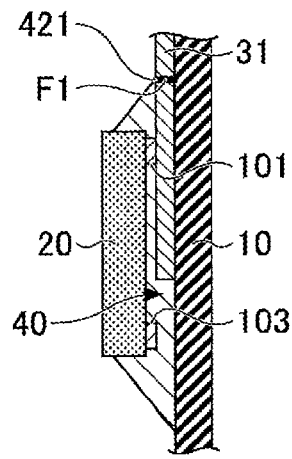
FIG. 8 is a diagram explaining the crack in the first embodiment.

FIG. 5A, FIG. 5B, FIG. 6A, and FIG. 6B are diagrams explaining comparative examples, and are top views of the comparative examples corresponding to FIG. 3. FIG. 7A, FIG. 7B, and FIG. 8 are diagrams illustrating a crack in the antenna wiring 31 of the RFID tag 1 according to the embodiment. FIG. 7A and FIG. 7B are top views, and FIG. 8 is a cross-sectional view along line C-C in FIG. 7B. Further, in FIG. 5A through FIG. 7B an illustration of the substrate 10 is omitted.

Figure 5A:
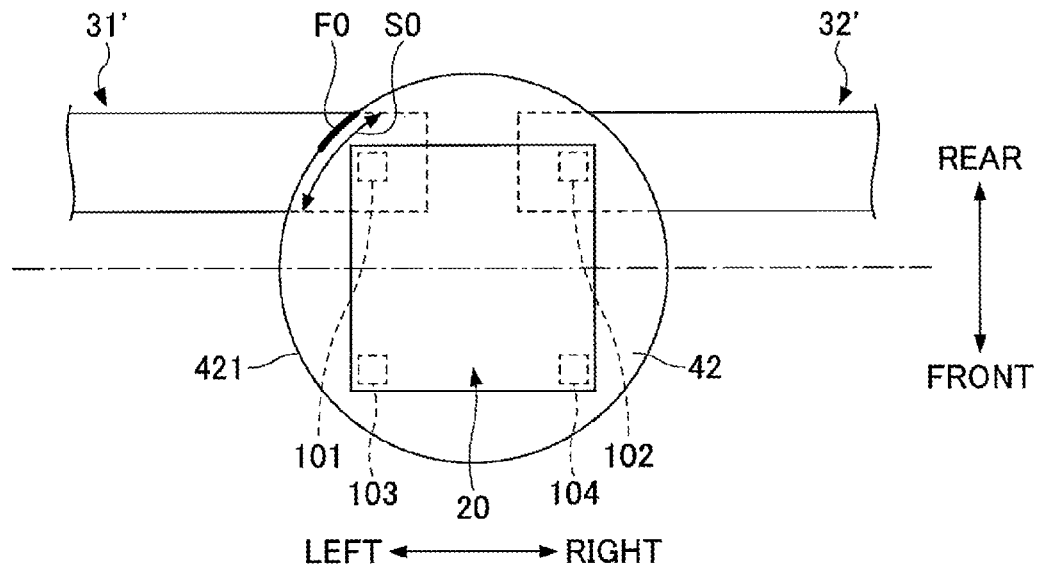
FIG. 5A is a diagram (No. 1) explaining a comparative example.
Figure 5B:
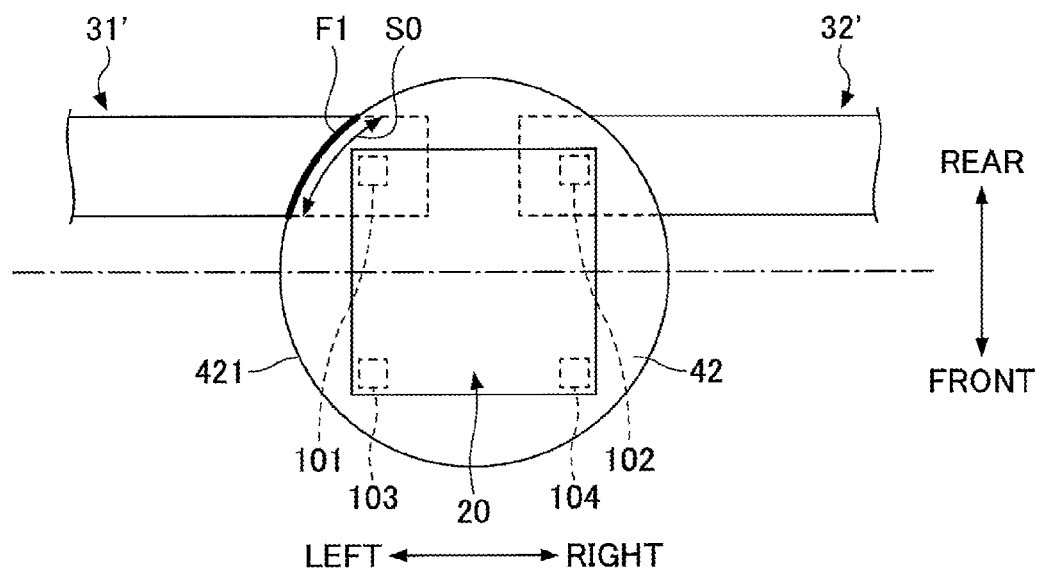
FIG. 5B is a diagram (No. 2) explaining the comparative example.
Figure 6A:
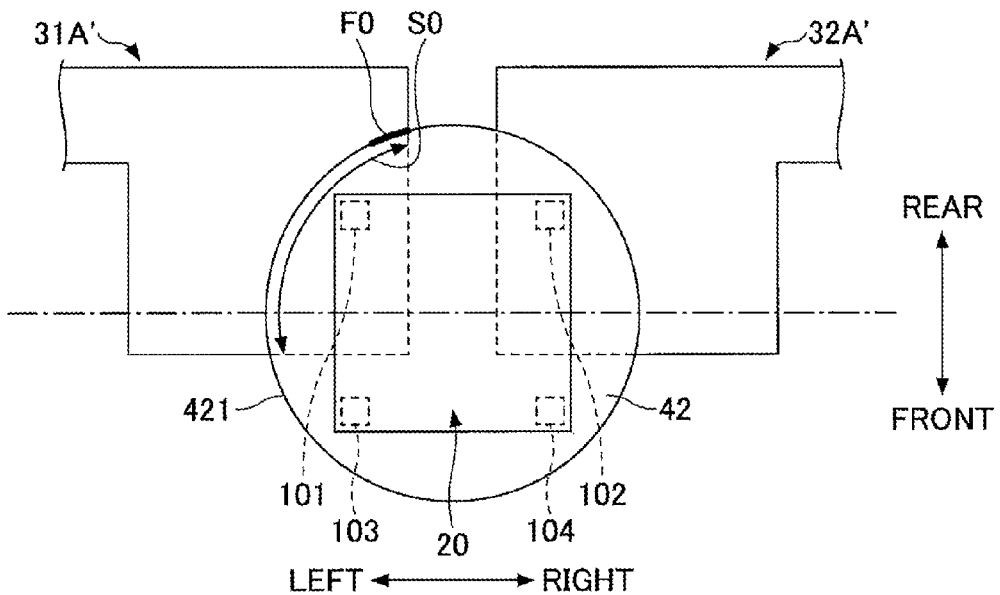
FIG. 6A is a diagram (No. 1) explaining a comparative example.
Figure 6B:
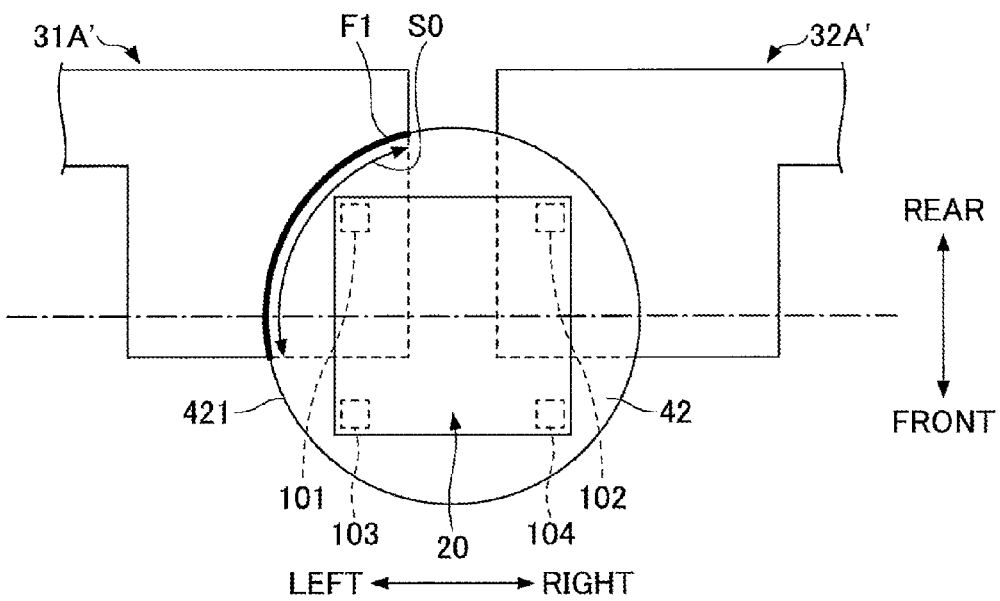
FIG. 6B is a diagram (No. 2) explaining the comparative example.

According to the comparative example illustrated in FIG. 5A and FIG. 5B, an antenna wiring 31' is electrically coupled to a bump 101 via a single path formed at a filet edge 421, and an antenna wiring 32' is electrically coupled to a bump 102 via a single path formed at the filet edge 421. An antenna wiring 31A' and an antenna wiring 32A' according to the comparative example illustrated in FIG. 6A and FIG. 6B differs from the antenna wiring 31' and the antenna wiring 32' according to the comparative example illustrated in FIG. 5A and FIG. 5B in that the width is enlarged at the ends thereof.

Here, according to the embodiment, the antenna portion 30 is electrically coupled to the IC chip 20 via the filet edge 421, which decreases a probability that the edge of the IC chip 20 comes into contact with the antenna portion 30, due to the bending of the substrate 10, etc., to cause the antenna portion 30 to be broken. Specifically, in the bending state of the substrate 10, etc., the edge of the IC chip 20 does not directly abut the antenna wiring 31 and the antenna wiring 32, which can reduce the probability of the crack of the antenna wiring 31 and the antenna wiring 32 due to the edge of the IC chip 20.

On the other hand, according to the embodiment, in the bending state of the substrate 10, etc., the filet edge 421 of the adhesive layer 40 tends to be a start point of the crack that may be produced in the antenna wirings 31 and 32. In particular, according to the embodiment, the substrate 10 is flexible while the adhesive layer 40 is solid in comparison with the substrate 10. Thus, in the bending state of the substrate 10, etc., a stress concentration may occur at a boundary (i.e., the filet edge 421) between the adhesive layer 40 and the antenna portion 30, which causes the crack in the antenna portion 30. This also holds true for the comparative examples. According to the comparative examples, as schematically illustrated in FIG. 5A, once the crack F0 is produced in the section S0 of the filet edge 421 in the antenna wiring 31', the crack F0 extends over the section S0 of the filet edge 421 in a stroke, which results in the crack in the antenna wiring 31' throughout its width, as schematically illustrated in FIG. 5B. In other words, as schematically illustrated with a symbol F1 in FIG. 5B, the antenna wiring 31' is broken to fall in a disabled state for communication. It is noted that the progress of the crack from the state F0 to the state F1 occurs within a short term similarly even in the example in which the width of the antenna wiring 31' is increased (see FIG. 6A and FIG. 6B).

In contrast, according to the embodiment, as schematically illustrated with a symbol F1 in FIG. 7B and FIG. 8, in the bending state of the substrate 10, etc., the crack may be produced in the antenna wiring 31 based on the same principle as described above with reference to the comparative examples. Specifically, as illustrated in FIG. 7A, once the crack F0 is produced in the section S1 of the filet edge 421 in the antenna wiring 31, the crack F0 extends over the section S0 of the filet edge 421 in a stroke, which causes the antenna wiring 31 to be broken. However, the progress of the crack in the section S1 of the filet edge 421 remains only in the section S1 due to the section S5. In other words, the crack produced in the section S1 of the filet edge 421 does not induce the crack in the section S2 due to the section S5. As a result of this, even if the crack F1 illustrated in FIG. 7B and FIG. 8 is produced, the electrically connection from the antenna wiring 31 to the bump 101 via the second path 72 is still maintained. In other words, according to the embodiment, even if the crack F1 illustrated in FIG. 7B and FIG. 8 is produced, the RFID tag 1 does not fall in the disabled state for the communication. In this way, the embodiment can increase the probability that the RFID tag 1 can maintain the communication function even if the antenna wiring 31 and the antenna wiring 32 are broken at the filet edge 421 of the adhesive layer 40.

Here, according to the embodiment, the RFID tag 1 is flexible because the substrate 10, the protective layers 12, and the sheathing portion 14 are flexible. Such a flexible RFID tag 1 is suited for clothes, bedding, etc., with which the skin of a user comes into contact. This is because the RFID tag 1 is flexible and thus reduces the probability that the user who wears the clothes, etc., with the RFID tag 1 feels strange due to the RFID tag 1. Further, the RFID tag 1 to be attached to the clothes, the bedding, etc., is subject to a load from the outside to be deformed in a machine washing process, and thus the flexibility of the RFID tag 1 is required.

The objects such as the uniforms, bed sheets, pillow covers, etc., are subject to washing, dewatering, ironing, and folding in batch in a large scale washing facility. Thus, the RFID tags 1 are used for the management of the objects, the RFID tags 1 are also subject to the same machine washing process together with the objects in the large scale washing facility. In such a machine washing process, the dewatering process (pressure dewatering (60 bars), for example) and the ironing process (with a large scale roll iron, for example), in particular, produce severe circumstances for the RFID tags 1. This is because these circumstances produce the load to cause the RFID tag 1 to be deformed, which increases the probability of the break of the antenna portion 30. According to the embodiment, the RFID tag 1 increases the probability that the communication function is maintained even if the antenna wiring 31 and the antenna wiring 32 are broken at the filet edge 421 of the adhesive layer 40, as described above, and thus can maintain the increased durability even in such severe circumstances.

Next, with reference to FIG. 9 through FIG. 17, variants to the RFID tag 1 according to the first embodiment described above are described. It is noted that, in the following variants, elements that may be the same as those according to the first embodiment described above are given the same reference numbers, and an explanation thereof is omitted.

[First Variation]

Figure 9:
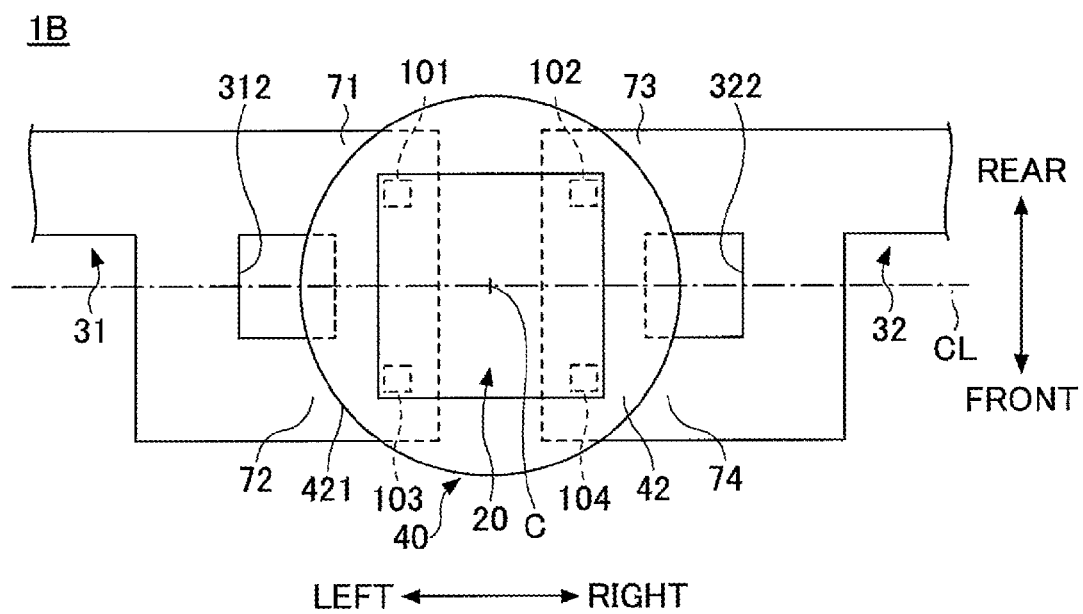
FIG. 9 is a top view schematically illustrating a configuration of a part of an RFID tag according to a first variant.

FIG. 9 is a top view schematically illustrating a configuration of a part (corresponding to X portion in FIG. 1) of an RFID tag 1B according to a first variant.

The RFID tag 1B differs from the RFID tag 1 according to the first embodiment described above in a positional relationship between the antenna wirings 31, 32 and the IC chip 20 (and thus the adhesive layer 40) in the front and rear direction. Specifically, according to the first variant, the antenna wirings 31 and 32 are located such that the centers of the apertures 312 and 322 are on the center line CL of the substrate 10 (not illustrated in FIG. 9).

According to the first variant illustrated in FIG. 9, the same effects as the first embodiment described above can be obtained. Further, according to the first variant illustrated in FIG. 9, the antenna wirings 31 and 32 are located such that the centers of the apertures 312 and 322 are on the center line CL. With this arrangement, even if there is an error with respect to a design value based on a nominal positional relationship between the antenna wiring 31 and the IC chip 20 in the front and rear direction, the double-path (i.e., the first path 71 and the second path 72) at the filet edge 421 with respect to the antenna wiring 31 can be implemented with the increased probability. Similarly, even if there is an error with respect to a design value based on a nominal positional relationship between the antenna wiring 32 and the IC chip 20 in the front and rear direction, the double-path (i.e., the third path 73 and the fourth path 74) at the filet edge 421 with respect to the antenna wiring 32 can be implemented with the increased probability.

[Second Variation]

Figure 10:
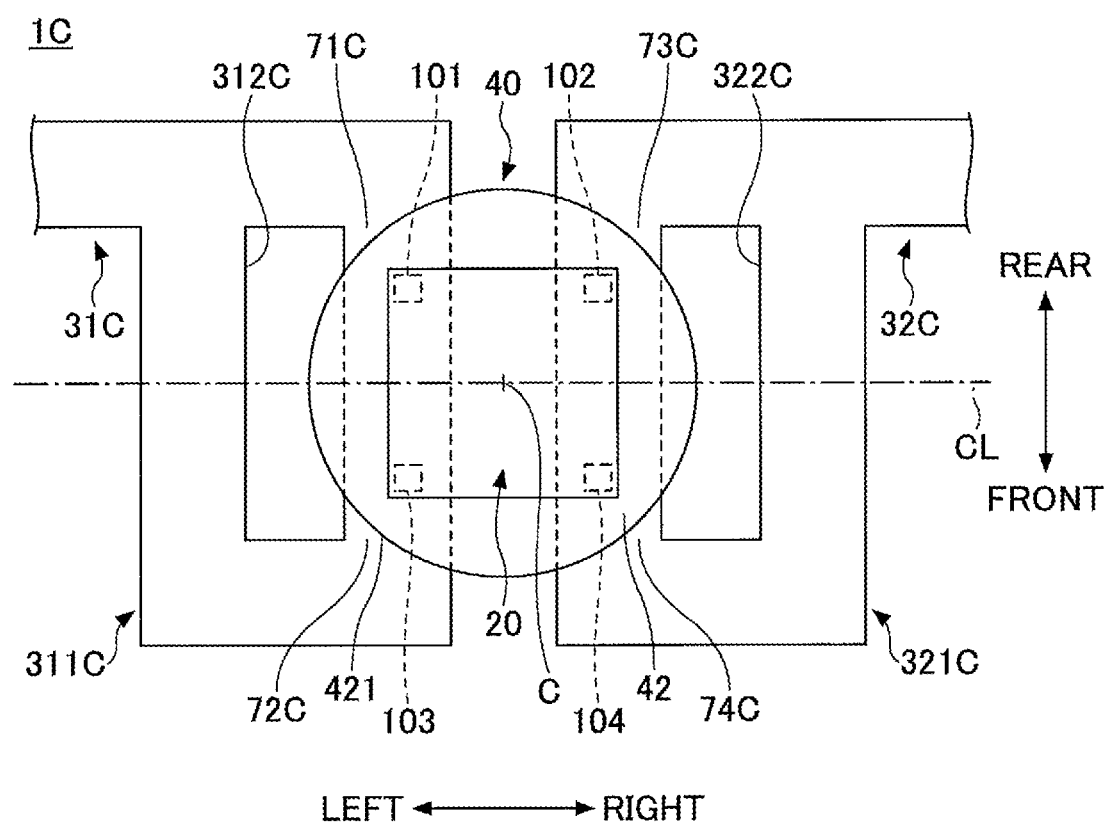
FIG. 10 is a top view schematically illustrating a configuration of a part of an RFID tag according to a second variant.

FIG. 10 is a top view schematically illustrating a configuration of a part (corresponding to X portion in FIG. 1) of an RFID tag 1C according to a second variant.

The RFID tag 1C differs from the RFID tag 1 according to the first embodiment described above in that the antenna wirings 31 and 32 are replaced with antenna wirings 31C and 32C, respectively. The antenna wirings 31C and 32C differ from the antenna wirings 31 and 32 according to the first embodiment described above in that the land portions 311 and 321 are replaced with land portions 311C and 321C, respectively. Specifically, the land portions 311 and 321 each have a square shape, while the land portions 311C and 321C each have rectangular shapes which have a longer side in the front and rear direction. Similarly, apertures 312C and 322C of the land portions 311C and 321C each have rectangular shapes which have a longer side in the front and rear direction. It is noted that, in the example illustrated in FIG. 10, as is the case with the first variant described above, the antenna wirings 31C and 32C are located such that the centers of the apertures 312C and 322C are on the center line CL of the substrate 10 (not illustrated in FIG. 10). However, the antenna wirings 31C and 32C may be formed such that the centers of the apertures 312C and 322C are offset with respect to the center line CL of the substrate 10 in the front or rear direction from the position illustrated in FIG. 10.

According to the second variant illustrated in FIG. 10, the same effects as the first embodiment described above can be obtained. Further, according to the second variant illustrated in FIG. 10, the apertures 312C and 322C as well as the land portions 311C and 321C have rectangular shapes which have a longer side in the front and rear direction. With this arrangement, even if there is an error with respect to a design value based on a nominal positional relationship between the antenna wiring 31C and the IC chip 20 in the front and rear direction, the double-path (i.e., the first path 71C and the second path 72C) at the filet edge 421 with respect to the antenna wiring 31C can be implemented with the increased probability. Similarly, even if there is an error with respect to a design value based on a nominal positional relationship between the antenna wiring 32C and the IC chip 20 in the front and rear direction, the double-path (i.e., the third path 73C and the fourth path 74C) at the filet edge 421 with respect to the antenna wiring 32C can be implemented with the increased probability.

[Third Variation]

Figure 11:
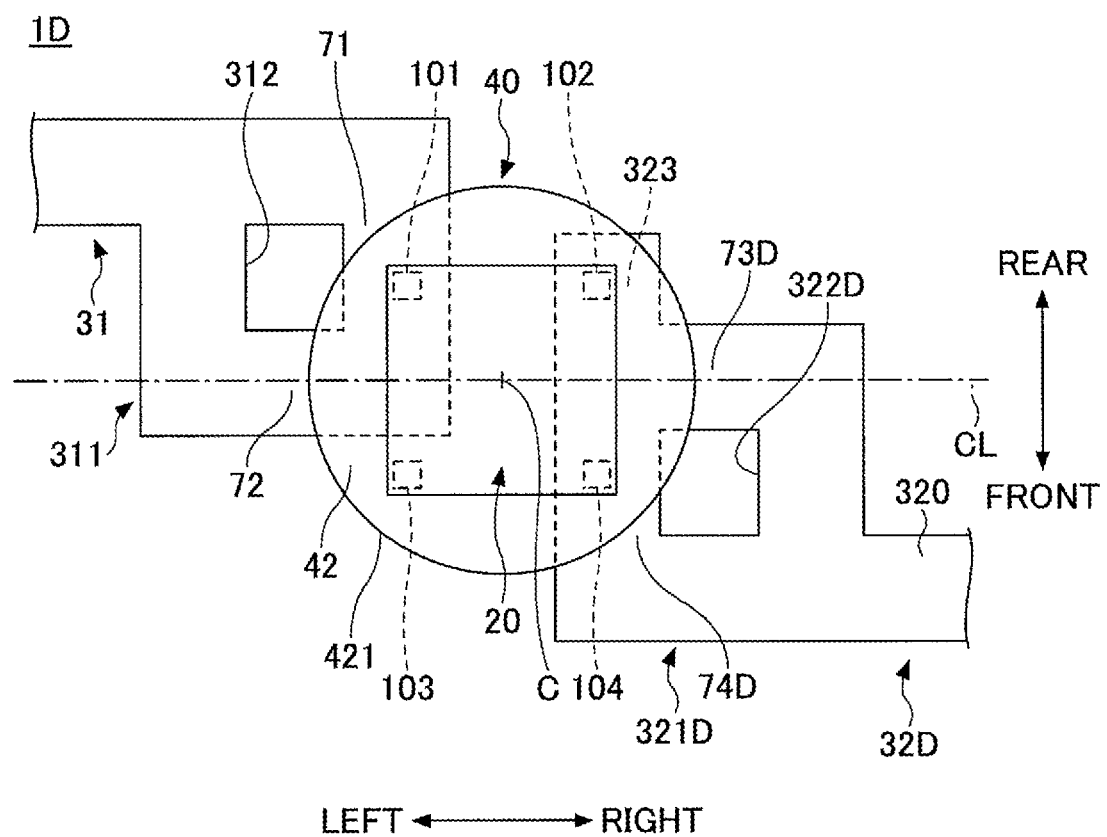
FIG. 11 is a top view schematically illustrating a configuration of a part of an RFID tag according to a third variant.

FIG. 11 is a top view schematically illustrating a configuration of a part (corresponding to X portion in FIG. 1) of an RFID tag 1D according to a second variant.

The RFID tag 1D differs from the RFID tag 1 according to the first embodiment described above in that the antenna wiring 32 is replaced with an antenna wiring 32D. Specifically, the antenna wiring 32D is located such that the antenna wiring 32D is offset with respect to antenna wiring 31 in the front direction. Further, the antenna wiring 32D is formed such that a land portion 321D thereof is formed on a rear side with respect to the antenna body 320 thereof. The land portion 321D is formed such that a portion thereof on the rear side with respect to the aperture 322D is on the center line CL. The land portion 321D includes an extension portion 323 that protrudes in the rear direction at the rear side of the square shape thereof and at a corner on the side of the center C. The land portion 321D is electrically coupled to the IC chip 20 at the extension portion 323 via the bump 102.

According to the third variant illustrated in FIG. 11, the same effects as the first embodiment described above can be obtained. Specifically, according to the third variant illustrated in FIG. 11, the double-path (i.e., the first path 71D and the second path 72D) at the filet edge 421 with respect to the antenna wiring 31D can be implemented. Similarly, the double-path (i.e., the third path 73D and the fourth path 74D) at the filet edge 421 with respect to the antenna wiring 32D can be implemented.

[Fourth Variation]

Figure 12:
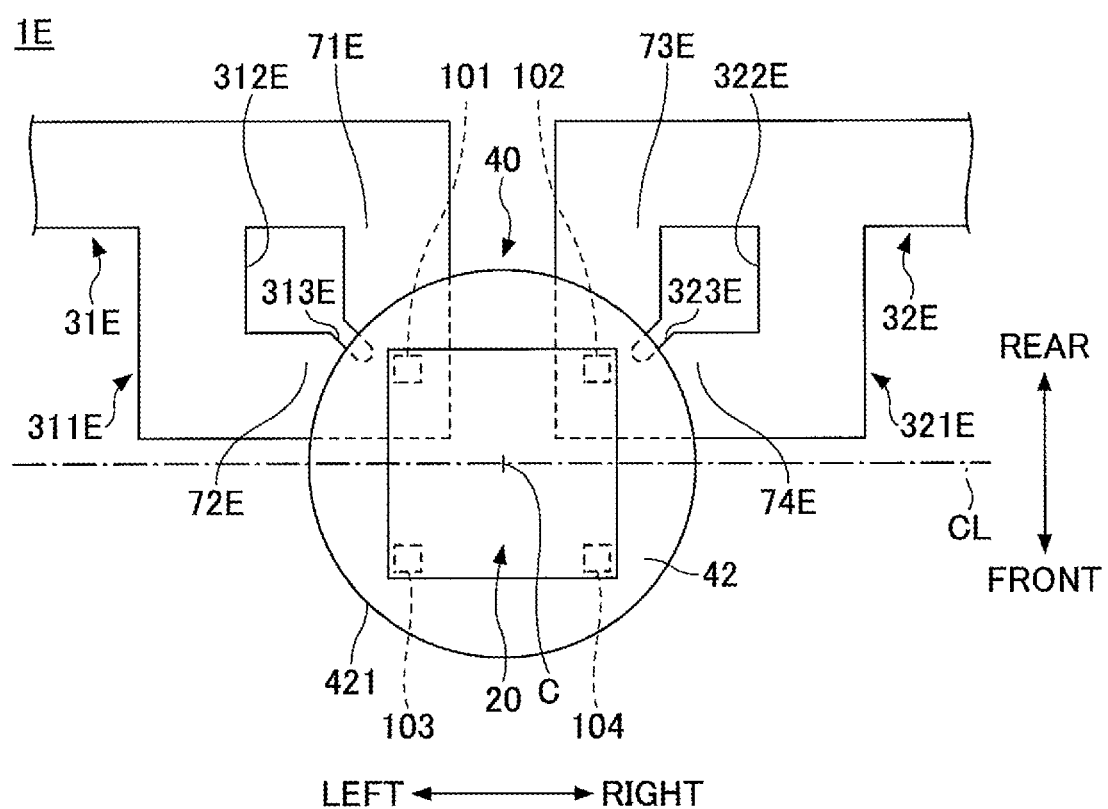
FIG. 12 is a top view schematically illustrating a configuration of a part of an RFID tag according to a fourth variant.

FIG. 12 is a top view schematically illustrating a configuration of a part (corresponding to X portion in FIG. 1) of an RFID tag 1E according to a fourth variant.

The RFID tag 1E differs from the RFID tag 1 according to the first embodiment described above in that the antenna wirings 31 and 32 are replaced with antenna wirings 31E and 32E, respectively. The antenna wirings 31E and 32E differs from the antenna wirings 31 and 32 according to the first embodiment described above in that the land portions 311 and 321 are replaced with land portions 311E and 321E. Further, the antenna wirings 31E and 32E differs from the antenna wirings 31 and 32 according to the first embodiment described above in that the antenna wirings 31E and 32E are offset in the rear direction with respect to the IC chip 20.

The antenna wirings 31E and 32E have apertures 312E and 322E formed therein, respectively. The apertures 312E and 322E have slits 313E and 323E formed therein, respectively. The slit 313E is formed such that the slit 313E crosses the filet edge 421, as illustrated in FIG. 12. With this arrangement, the double-path (i.e., the first path 71E and the second path 72E) at the filet edge 421 with respect to the antenna wiring 31E can be implemented. Further, the slit 323E is formed such that the slit 323E crosses the filet edge 421, as illustrated in FIG. 12. With this arrangement, the double-path (i.e., the third path 73E and the fourth path 74E) at the filet edge 421 with respect to the antenna wiring 32E can be implemented.

[Fifth Variation]

Figure 13:
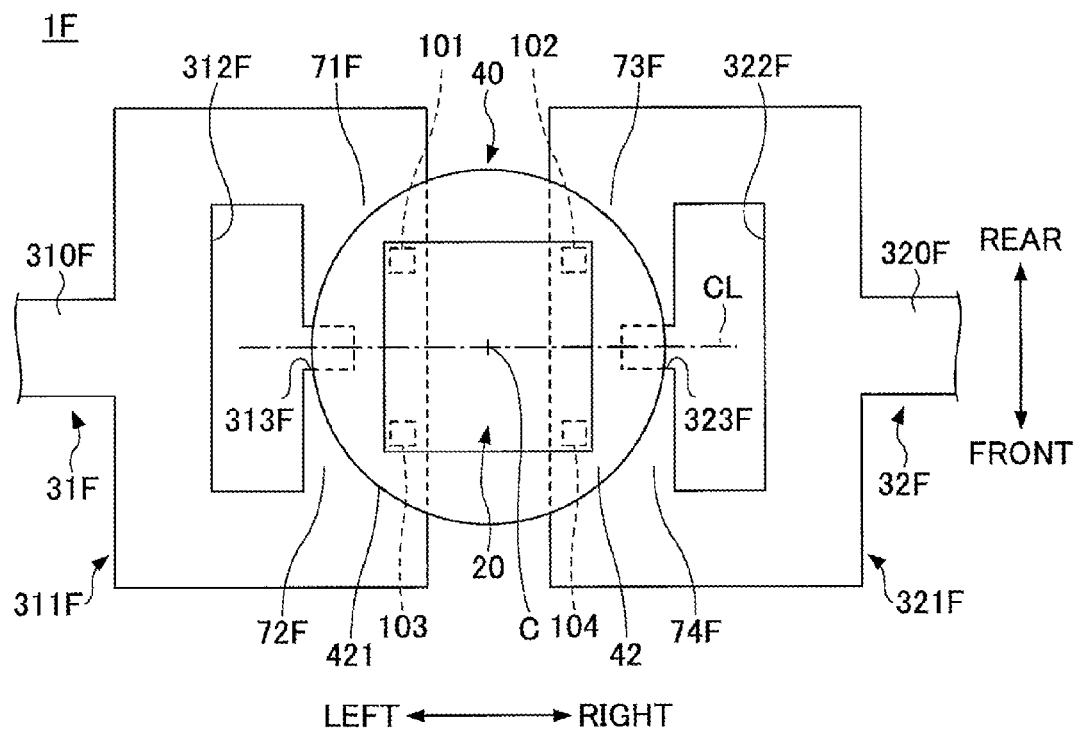
FIG. 13 is a top view schematically illustrating a configuration of a part of an RFID tag according to a fifth variant.

FIG. 13 is a top view schematically illustrating a configuration of a part (corresponding to X portion in FIG. 1) of an RFID tag 1F according to a fifth variant.

The RFID tag 1F differs from the RFID tag 1 according to the first embodiment described above in that the antenna wirings 31 and 32 are replaced with antenna wirings 31F and 32F, respectively. The antenna wirings 31F and 32F differ from the antenna wirings 31 and 32 according to the first embodiment described above in that the land portions 311 and 321 are replaced with land portions 311F and 321F. Further, the antenna wirings 31F and 32F differ from the antenna wirings 31 and 32 according to the first embodiment described above in that antenna bodies 310F and 320F are on the center line CL.

Land portions 311F and 321F of the antenna wirings 31F and 32F are formed such that the antenna bodies 310F and 320F have the width enlarged in the front and rear direction, respectively. The land portions 311F and 321F each have rectangular shapes which have a longer side in the front and rear direction. Similarly, apertures 312F and 322F of the land portions 311F and 321F each have rectangular shapes which have a longer side in the front and rear direction. The apertures 312F and 322F have slits 313F and 323F formed therein, respectively. The slit 313F is formed such that the slit 313F crosses the filet edge 421, as illustrated in FIG. 13. With this arrangement, the double-path (i.e., the first path 71F and the second path 72F) at the filet edge 421 with respect to the antenna wiring 31F can be implemented. Further, the slit 323F is formed such that the slit 323F crosses the filet edge 421, as illustrated in FIG. 13. With this arrangement, the double-path (i.e., the third path 73F and the fourth path 74F) at the filet edge 421 with respect to the antenna wiring 32F can be implemented.

[Sixth Variation]

Figure 14:
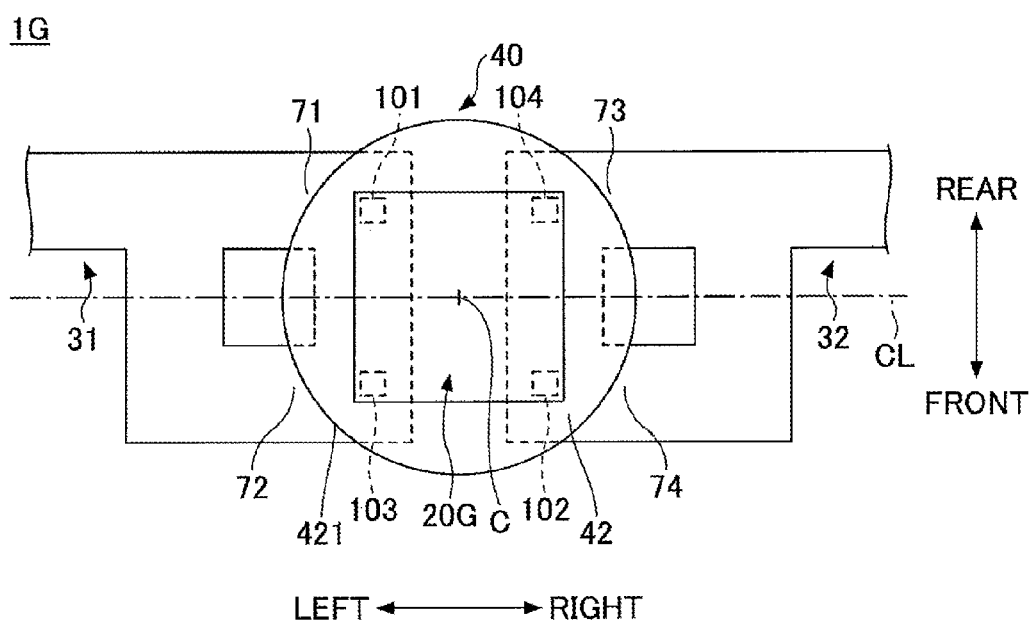
FIG. 14 is a top view schematically illustrating a configuration of a part of an RFID tag according to a sixth variant.

FIG. 14 is a top view schematically illustrating a configuration of a part (corresponding to X portion in FIG. 1) of an RFID tag 1G according to a sixth variant.

The RFID tag 1G differs from the RFID tag 1 according to the first embodiment described above in that the IC chip 20 is replaced with an IC chip 20G. The IC chip 20G differs from the IC chip 20 according to the first embodiment described above in that the bump 101 and the bump 102 are disposed in a diagonal relationship. The RFID tag 1G differs from the RFID tag 1 according to the first embodiment described above in a positional relationship between the antenna wirings 31, 32 and the IC chip 20 (and thus the adhesive layer 40) in the front and rear direction, as is the case with the first variant described above.

According to the sixth variant illustrated in FIG. 14, the same effects as the first embodiment described above can be obtained.

[Seventh Variation]

Figure 15:
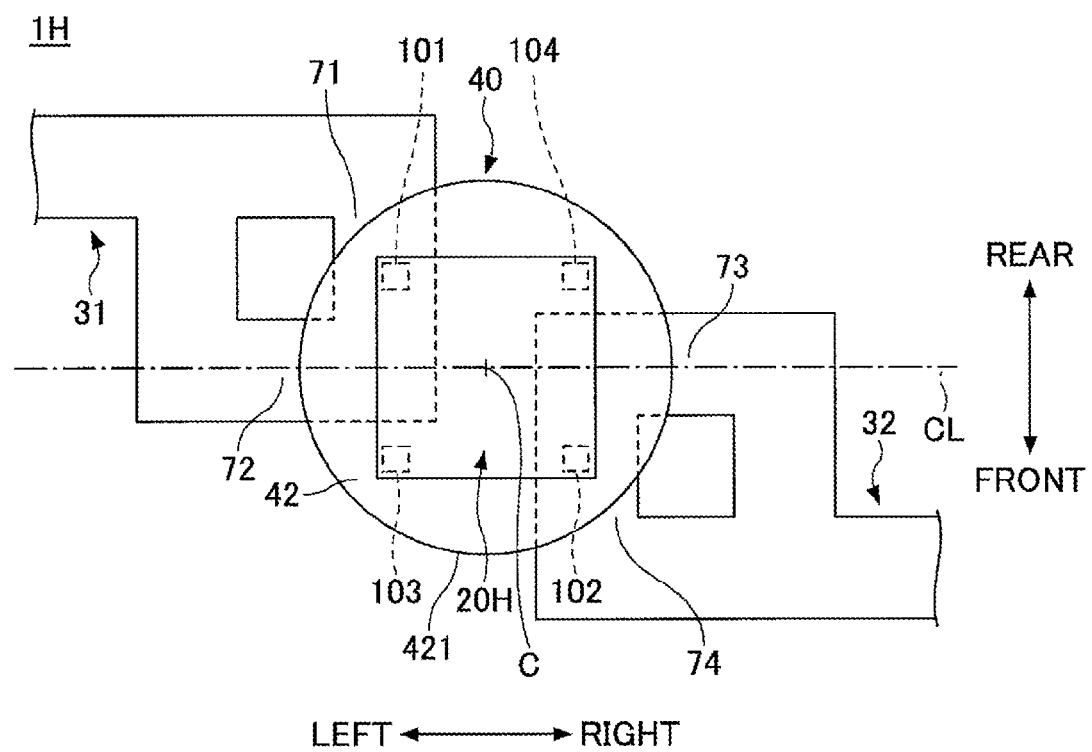
FIG. 15 is a top view schematically illustrating a configuration of a part of an RFID tag according to a seventh variant.

FIG. 15 is a top view schematically illustrating a configuration of a part (corresponding to X portion in FIG. 1) of an RFID tag 1H according to a seventh variant.

The RFID tag 1H differs from the RFID tag 1 according to the first embodiment described above in that the IC chip 20 is replaced with an IC chip 20H. The IC chip 20H differs from the IC chip 20 according to the first embodiment described above in that the bump 101 and the bump 102 are disposed in a diagonal relationship. Further, the RFID tag 1H differs from the RFID tag 1 according to the first embodiment described above in a positional relationship between the antenna wirings 31, 32 and the IC chip 20 (and thus the adhesive layer 40) in the front and rear direction.

According to the seventh variant illustrated in FIG. 15, the same effects as the first embodiment described above can be obtained.

[Eighth Variation]

Figure 16:
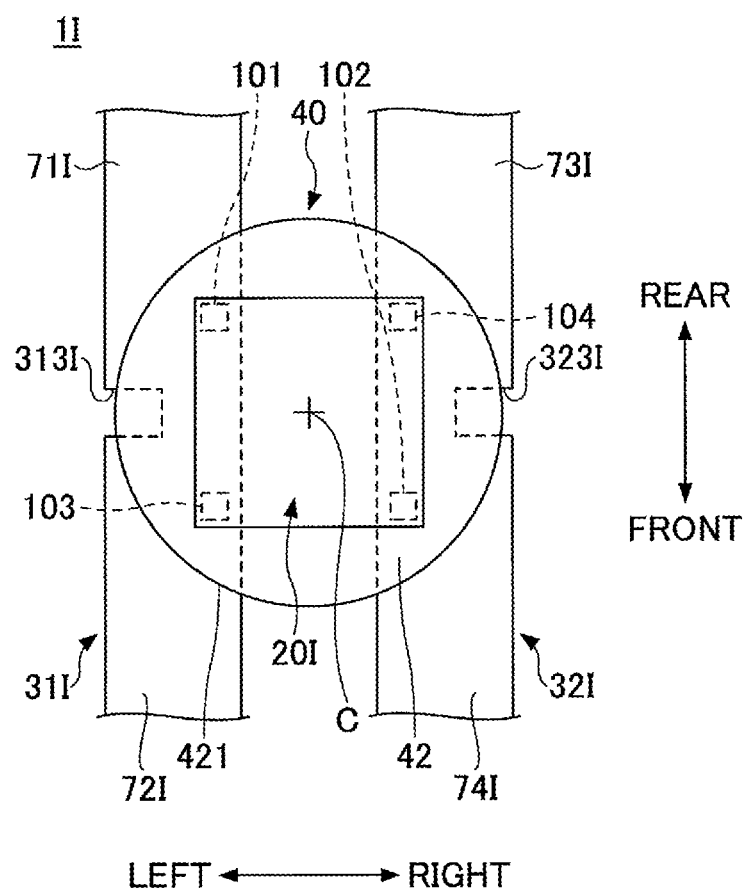
FIG. 16 is a top view schematically illustrating a configuration of a part of an RFID tag according to an eighth variant.

FIG. 16 is a top view schematically illustrating a configuration of a part (corresponding to X portion in FIG. 1) of an RFID tag 1I according to an eighth variant.

The RFID tag 1I differs from the RFID tag 1 according to the first embodiment described above in that the IC chip 20 is replaced with an IC chip 20I. The IC chip 20I differs from the IC chip 20 according to the first embodiment described above in that the bump 101 and the bump 102 are disposed in a diagonal relationship. The RFID tag 1I differs from the RFID tag 1 according to the first embodiment described above in that the antenna wirings 31 and are replaced with antenna wirings 311 and 321, respectively.

The antenna wirings 311 and 321 extend in the front and rear direction to pass below the bumps 101 and 102, respectively, and have slits 3131 and 3231 formed therein, respectively. The slit 3131 is formed such that the slit 3131 crosses the filet edge 421, as illustrated in FIG. 16. With this arrangement, the double-path (i.e., the first path 711 and the second path 721) at the filet edge 421 with respect to the antenna wiring 311 can be implemented. Further, the slit 3231 is formed such that the slit 3231 crosses the filet edge 421, as illustrated in FIG. 16. With this arrangement, the double-path (i.e., the third path 731 and the fourth path 741) at the filet edge 421 with respect to the antenna wiring 321 can be implemented.

[Ninth Variation]

Figure 17:
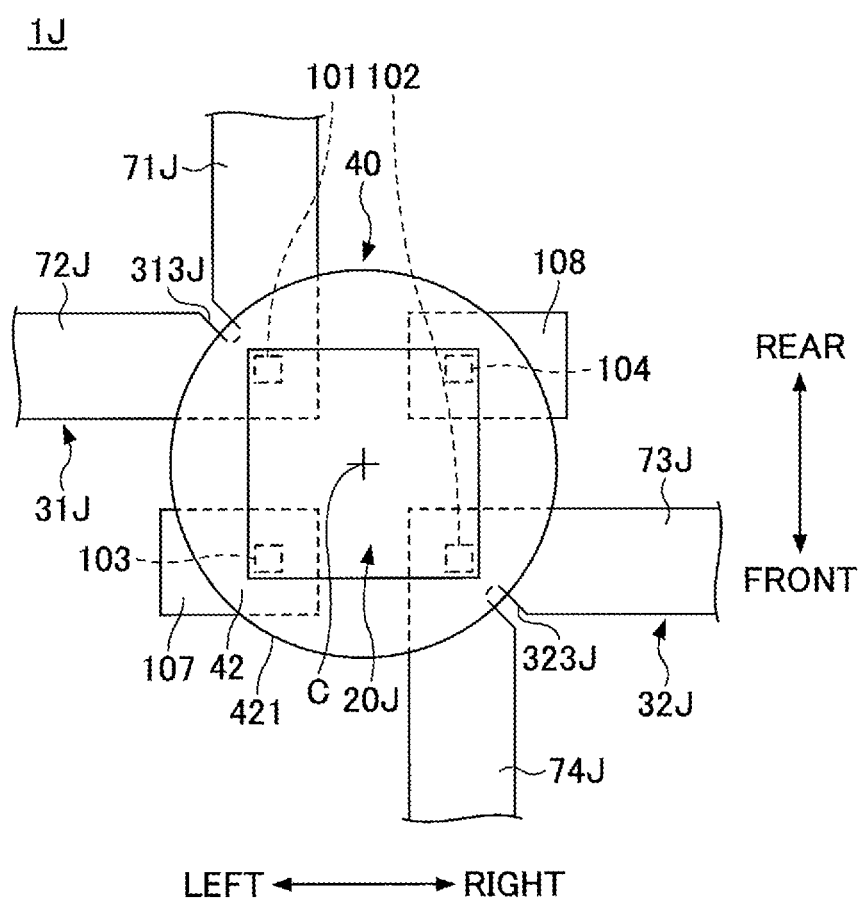
FIG. 17 is a top view schematically illustrating a configuration of a part of an RFID tag according to a ninth variant.

FIG. 17 is a top view schematically illustrating a configuration of a part (corresponding to X portion in FIG. 1) of an RFID tag 1J according to a ninth variant.

The RFID tag 1J differs from the RFID tag 1 according to the first embodiment described above in that the IC chip 20 is replaced with an IC chip 20J. The IC chip 20J differs from the IC chip 20 according to the first embodiment described above in that the bump 101 and the bump 102 are disposed in a diagonal relationship. The RFID tag 1J differs from the RFID tag 1 according to the first embodiment described above in that the antenna wirings 31 and are replaced with antenna wirings 31J and 32J, respectively.

The antenna wiring 31J is formed such that the antenna wiring 31J passes below the bump 101 and is bent from the front and rear direction to the left and right direction at a position below the bump 101. Similarly, the antenna wiring 32J is formed such that the antenna wiring 32J passes below the bump 102 and is bent from the front and rear direction to the left and right direction at a position below the bump 102. The antenna wirings 31J and 32J have slits 313J and 323J formed therein, respectively. The slit 313J is formed such that the slit 313J crosses the filet edge 421, as illustrated in FIG. 17. With this arrangement, the double-path (i.e., the first path 71J and the second path 72J) at the filet edge 421 with respect to the antenna wiring 31J can be implemented. Further, the slit 323J is formed such that the slit 323J crosses the filet edge 421, as illustrated in FIG. 17. With this arrangement, the double-path (i.e., the third path 73J and the fourth path 74J) at the filet edge 421 with respect to the antenna wiring 32J can be implemented. It is noted that, in the example illustrated in FIG. 17, conductive patterns 107 and 108 are formed such that the conductive patterns 107 and 108 extend below the dummy bumps 103 and 104, respectively. The conductive patterns 107 and 108 are provided to increase the stability of the IC chip 20J. Such conductive patterns 107 and 108 may be provided in other embodiments (including the variants thereof).

Second Embodiment

Next, a second embodiment is described. As described hereinafter, the second embodiment differs from the first embodiment described above in that triple-path at a filet edge (a division into three paths) is implemented. Elements that may be the same as those according to the first embodiment are given the same reference numbers in FIG. 18 and FIG. 19, and an explanation thereof is omitted.

Figure 18:
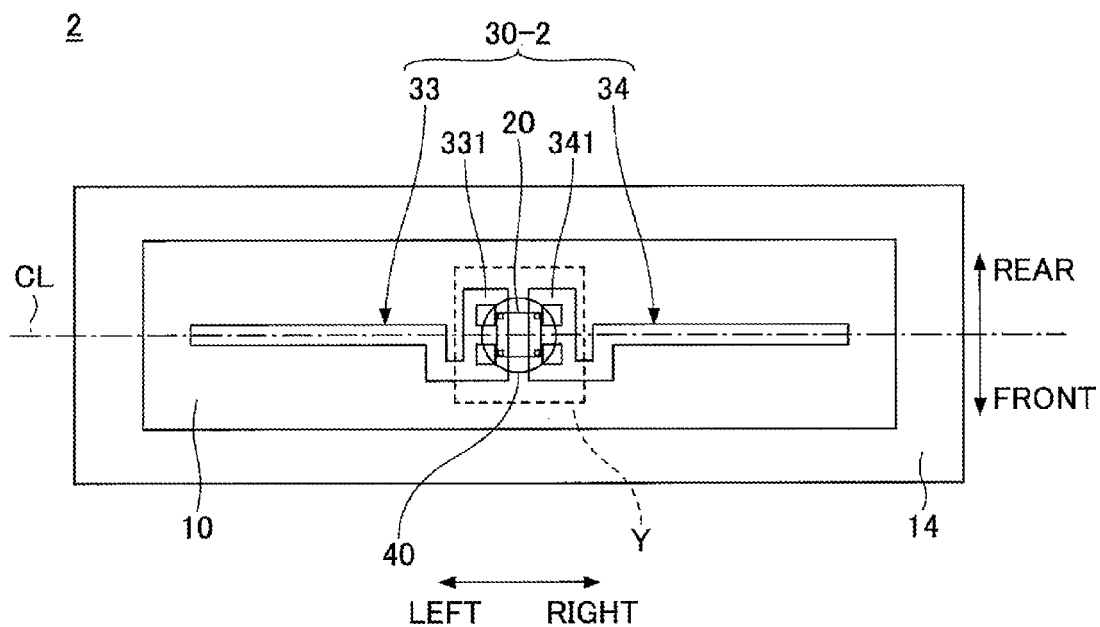
FIG. 18 is a top view schematically illustrating a configuration of an RFID tag according to a second embodiment.
Figure 19:
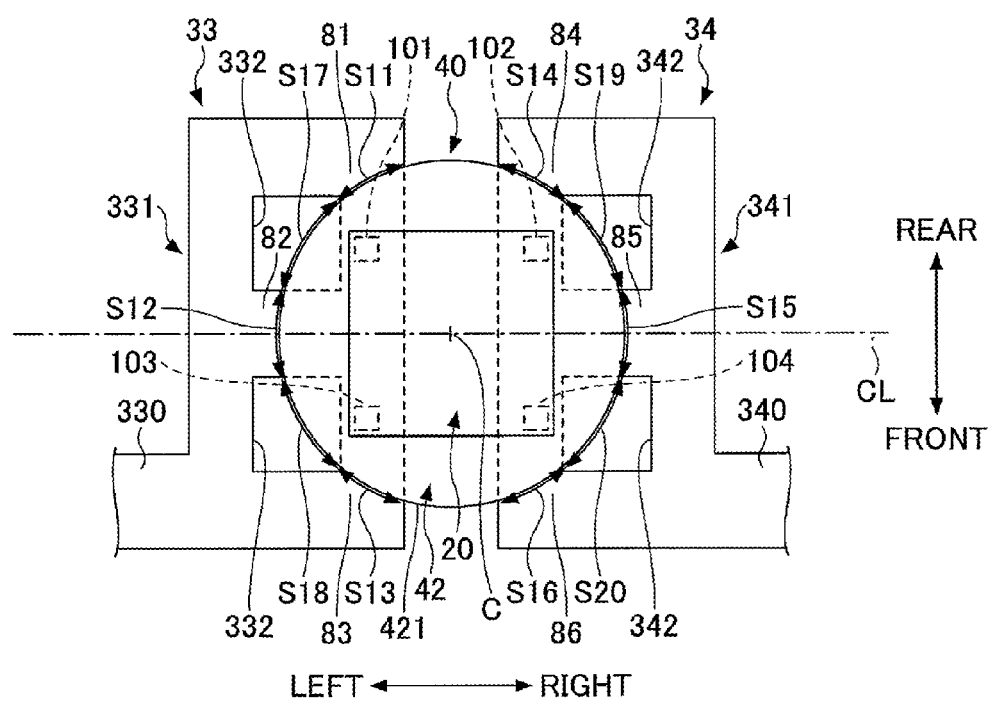
FIG. 19 is a magnified view of a portion Y in FIG. 18.

FIG. 18 is a top view schematically illustrating a configuration of an RFID tag according to a second embodiment. FIG. 19 is a magnified view of a portion Y in FIG. 18. In FIG. 18, an RFID tag 2 is illustrated transparently such that the inside of the RFID tag 2 can be seen. In FIG. 19, a portion located below the IC chip 20 or the adhesive layer 40 is illustrated with dotted lines. Further, in FIG. 19 an illustration of the substrate 10 is omitted. It is noted that the left and right direction, the front and rear direction, and the upper and lower direction are as defined above.

The RFID tag 2 differs from the RFID tag 1 according to the first embodiment described above in that the antenna wiring 30 is replaced with an antenna wiring 30-2.

The antenna portion 30-2 is formed in a form of a conducive pattern on the substrate 10. The antenna portion 30-2 has one end electrically coupled to the IC chip 20. The antenna portion 30-2 includes an antenna wiring 33 on a left side and an antenna wiring 34 on a right side. It is preferred that the antenna wirings 33 and 34 have the same length in the left and right direction.

The antenna wiring 33 includes an antenna body 330 and a land portion 331.

The antenna body 330 extends straight in the left and right direction with a predetermined width. It is noted that, in the example illustrated in FIG. 18, the antenna body 330 is bent in the front direction at right angle before the IC chip 20, and is bent again in the left and right direction to couple to the land portion 331. However, the antenna body 330 may be coupled to the land portion 331 without being bent, or may be coupled to the land portion 331 in other ways.

Figure 20:
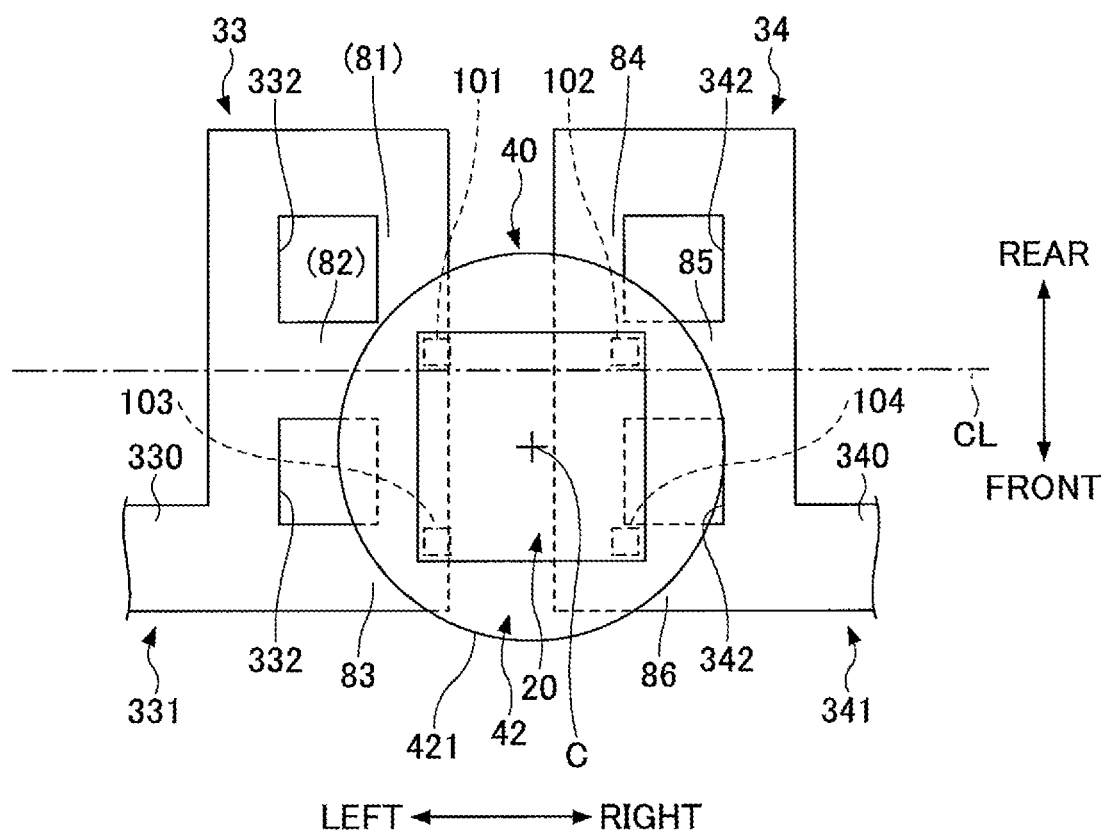
FIG. 20 is a diagram explaining an influence due to a mis-installation.

The land portion 331 is formed in an end of the antenna wiring 33 on the side of the bump 101. The land portion 331 has a rectangular form whose sides are substantially longer than the width of the antenna body 330, for example. In the example illustrated in FIG. 19 and FIG. 20, the land portion 331 is formed such that the width of the antenna body 330 is enlarged in only the rear direction. At the land portion 331, the antenna wiring 33 is electrically coupled to the IC chip 20 via the bump 101, as illustrated in FIG. 19 and FIG. 20. In the example illustrated in FIG. 19 and FIG. 20, the land portion 331 is formed on the left side with respect to the center C of the IC chip 20. In this case, a portion of the land portion 331 on the right side with respect to an aperture 332 (described hereinafter) is formed at the position of the bump 101.

The antenna body 330 of the antenna wiring is electrically coupled to the bump 101 via a plurality of paths formed at a filet edge 421 of the filet portion 42 of the adhesive layer 40. In the example illustrated in FIG. 19, there are three paths, that is to say, a first path 81, a second path 82 and a third path 83. Specifically, a section S11 of the filet edge 421 where the first path 81 passes, a section S12 of the filet edge 421 where the second path 82 passes, and a section S13 of the filet edge 421 where the third path 83 passes are separated via sections S17 and S18 of the filet edge 421. The sections S17 and S18 of the filet edge 421 are not on the antenna wiring 33. In this way, the antenna wiring 33 can be electrically coupled to the bump 101 via a plurality of paths formed at the filet edge 421. In other words, the triple-path (the first path 81, the second path 82, and the third path 83) at the filet edge 421 is implemented.

The first path 81, the second path 82, and the third path 83 extend to the bump 101 below the filet portion 42, respectively, to join into one, as illustrated in FIG. 19.

The first path 81, the second path 82, and the third path 83 are formed by two apertures 332 formed in the land portion 331, as illustrated in FIG. 19. The apertures 332 are formed in the land portion 331 such that the apertures 332 cross the filet edge 421, respectively. The apertures 332 are formed side by side in the front and rear direction.

Similarly, the antenna wiring 34 includes an antenna body 340 and a land portion 341.

The antenna body 340 extends straight in the left and right direction with a predetermined width. It is noted that, in the example illustrated in FIG. 18, the antenna body 340 is bent in the front direction at right angle before the IC chip 20, and is bent again in the left and right direction to couple to the land portion 341. However, the antenna body 330 may be coupled to the land portion 341 without being bent, or may be coupled to the land portion 331 in other ways.

The land portion 341 is formed in an end of the antenna wiring 34 on the side of the bump 102. The land portion 341 has a rectangular form whose sides are substantially longer than the width of the antenna body 340, for example. In the example illustrated in FIG. 19 and FIG. 20, the land portion 341 is formed such that the width of the antenna body 340 is enlarged in only the rear direction. At the land portion 341, the antenna wiring 34 is electrically coupled to the IC chip 20 via the bump 102, as illustrated in FIG. 19 and FIG. 20. In the example illustrated in FIG. 19 and FIG. 20, the land portion 341 is disposed on the right side with respect to the center C of the IC chip 20. In this case, a portion of the land portion 341 on the left side with respect to an aperture 342 (described hereinafter) is formed at the position of the bump 102.

The antenna body 340 of the antenna wiring is electrically coupled to the bump 102 via a plurality of paths formed at a filet edge 421 of the filet portion 42 of the adhesive layer 40. In the example illustrated in FIG. 19, there are three paths, that is to say, a fourth path 84, a fifth path 85 and a sixth path 86. Specifically, a section S14 of the filet edge 421 where the fourth path 84 passes, a section S15 of the filet edge 421 where the fifth path 85 passes, and a section S16 of the filet edge 421 where the sixth path 86 passes are separated via sections S19 and S20 of the filet edge 421. The sections S19 and S20 of the filet edge 421 are not on the antenna wiring 34. In this way, the antenna wiring 34 can be electrically coupled to the bump 102 via a plurality of paths formed at the filet edge 421. In other words, the triple-path (the fourth path 84, the fifth path 85, and the sixth path 86) at the filet edge 421 is implemented.

The fourth path 84, the fifth path 85, and the sixth path 86 extend to the bump 102 below the filet portion 42, respectively, to join into one, as illustrated in FIG. 19.

The fourth path 84, the fifth path 85, and the sixth path 86 are formed by two apertures 342 formed in the land portion 341. The apertures 342 are formed in the land portion 341 such that the apertures 342 cross the filet edge 421, respectively. The apertures 342 are formed side by side in the front and rear direction.

According to the second embodiment, the same effects as the first embodiment described above can be obtained. Further, according to the second embodiment, the triple-path at the filet edge 421 is implemented, which can decrease the probability that the RFID tag 2 falls in the disabled state for the communication, in comparison with the first embodiment in which the double-path at the filet edge 421 is implemented. Specifically, according to the second embodiment, with respect to the antenna wiring 33, for example, even if breaks occur in two sections, among the sections S11 through S13 of the filet edge 421, the RFID tag 2 does not fall in the disabled state for the communication.

Further, according to the second embodiment, even if there is an error with respect to a design value based on a nominal positional relationship between the antenna wiring 33 and the IC chip 20 in the front and rear direction, the double-path at the filet edge 421 with respect to the antenna wiring 33 can be implemented with the increased probability. This also holds true for the antenna wiring 34. For example, in the example illustrated in FIG. 20, the installation position of the IC chip 20 is shifted in the front direction and the right direction with respect to the design nominal position (i.e., the position illustrated in FIG. 19, for example). Specifically, "mis-registration" occurs such that the aperture 332 on the rear side does not cross the filet edge 421. However, in the example illustrated in FIG. 20, even though the trip-path at the filet edge 421 with respect to the antenna wiring 33 is not implemented, the double-path at the filet edge 421 is still implemented. Specifically, the first path 81 and the second path 82 are unified into one path, but the unified path and the third path 83 are still separated. This is because the apertures 332 on the front side still crosses the filet edge 421. It is noted that, in the first embodiment, as is apparent from contrast between FIG. 3 and FIG. 20, the mis-registration described above may prevent the double-path at the filet edge 421 with respect to the antenna wiring 31.

It is noted that, according to the second embodiment, the land portions 331 and 341 are formed such that the centers thereof in the front and rear direction are on the center line CL; however, the centers of the land portions 331 and 341 in the front and rear direction may be offset with respect to the center line CL. Further, the land portions 331 and 341 are formed symmetrically with respect to the center line CL, respectively; however, the land portions 331 and 341 may not be symmetric with respect to the center line CL.

Further, according to the second embodiment, the triple-path at the filet edge 421 is implemented; however, multi-path at the filet edge 421 more than three paths may be implemented.

Next, a condition to be met to implement the triple-path at the filet edge 421 is described with respect to the second embodiment described above.

Figure 21:
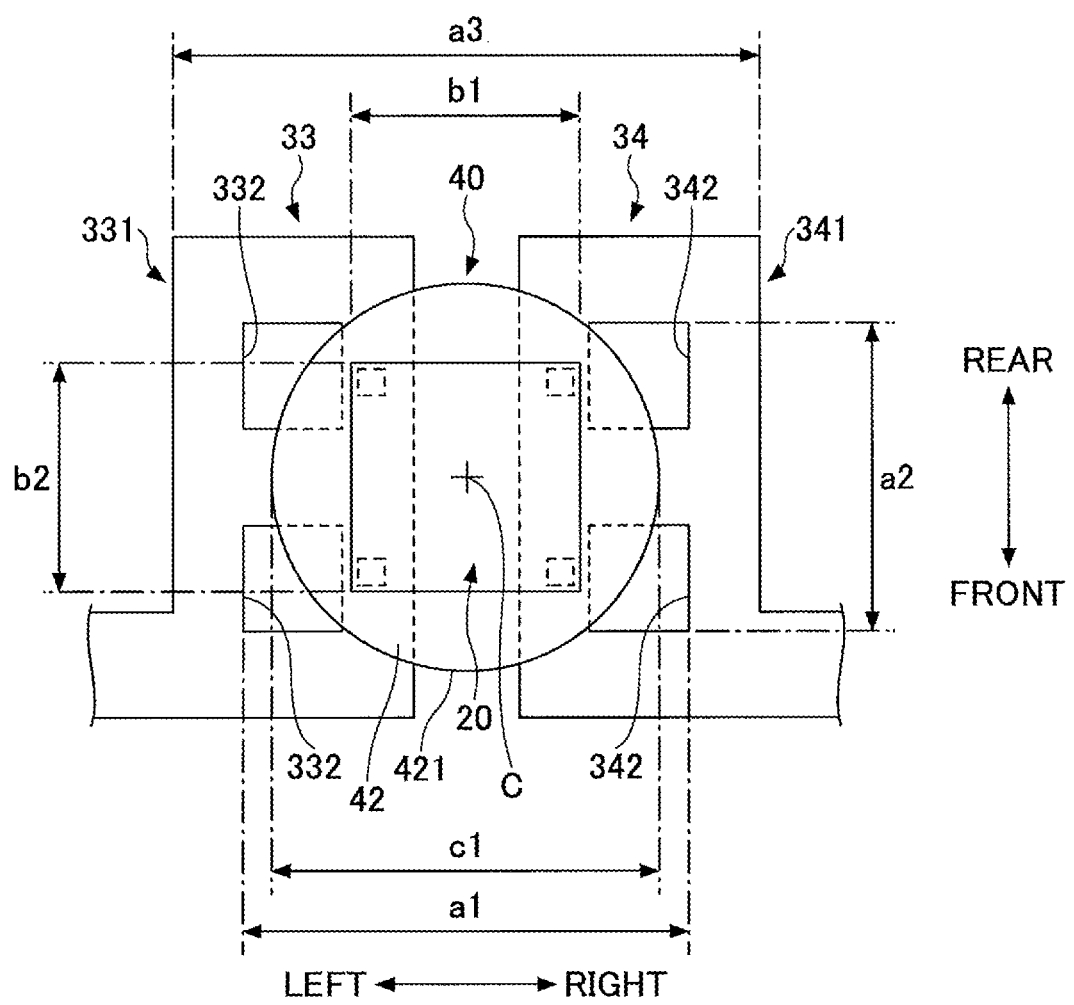
FIG. 21 is a diagram explaining respective dimensions.

FIG. 21 is a diagram explaining respective dimensions of the land portions 331, 341, the IC chip 20, and the filet edge 421.

Here, as illustrated in FIG. 21, it is assumed that the maximum distance between the apertures 332 and 342 in the left and right direction is "a1", and the maximum distance between the apertures 332 (this holds true for the aperture 342) in the front and rear direction is "a2". Further, it is assumed that the maximum distance between the land portions 331 and 341 in the left and right direction is "a3". Further, it is assumed that the length of the IC chip 20 in the left and right direction is "b1", and the length of the IC chip 20 in the front and rear direction is "b2". Further, it is assumed that the width of the filet edge 421 (the maximum dimension in the left and right direction) is "c1".

Figure 22:
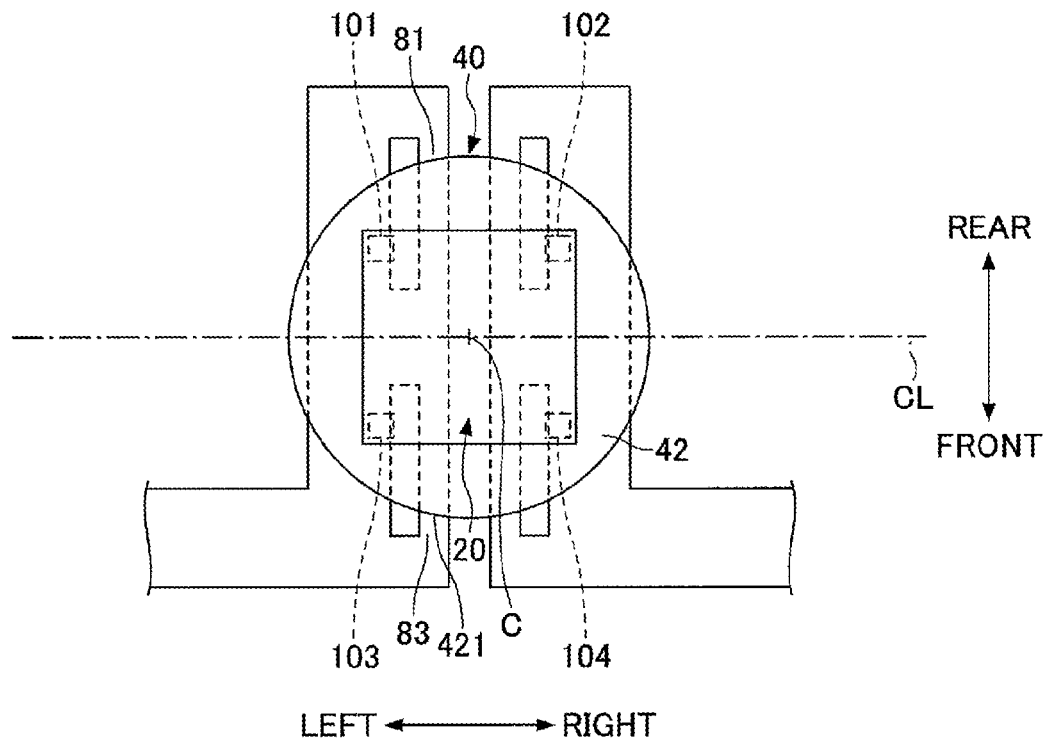
FIG. 22 is a diagram illustrating a configuration that does not meet a condition for a triple-path.

In this case, in order to implement the triple-path, it is necessary that a3 is greater than c1. This is because, if a3 is not greater than c1, as illustrated in FIG. 22, for example, the double-path, at most, can be implemented. In the example illustrated in FIG. 22, with respect to the antenna wiring on the left side, only the double-path at the filet edge 421 is implemented by the aperture on the front side. It is noted that, although the aperture on the rear side is also formed to cross the filet edge 421, this does not form paths to from the antenna body to the bump 101, and thus does not contribute to the multi-path at the filet edge.

Figure 23:
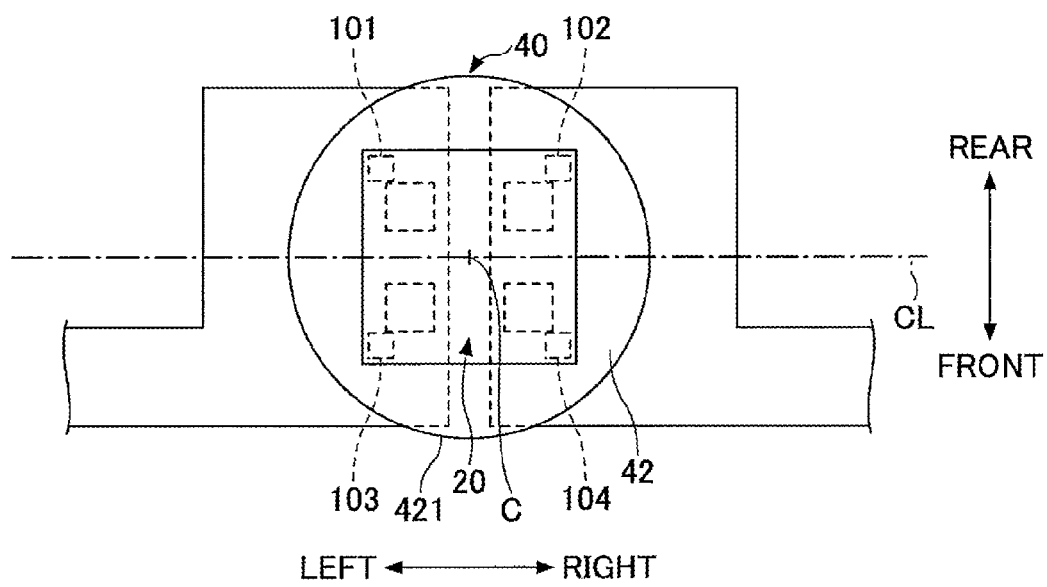
FIG. 23 is a diagram illustrating a configuration that does not meet a condition for a triple-path.
Figure 24:
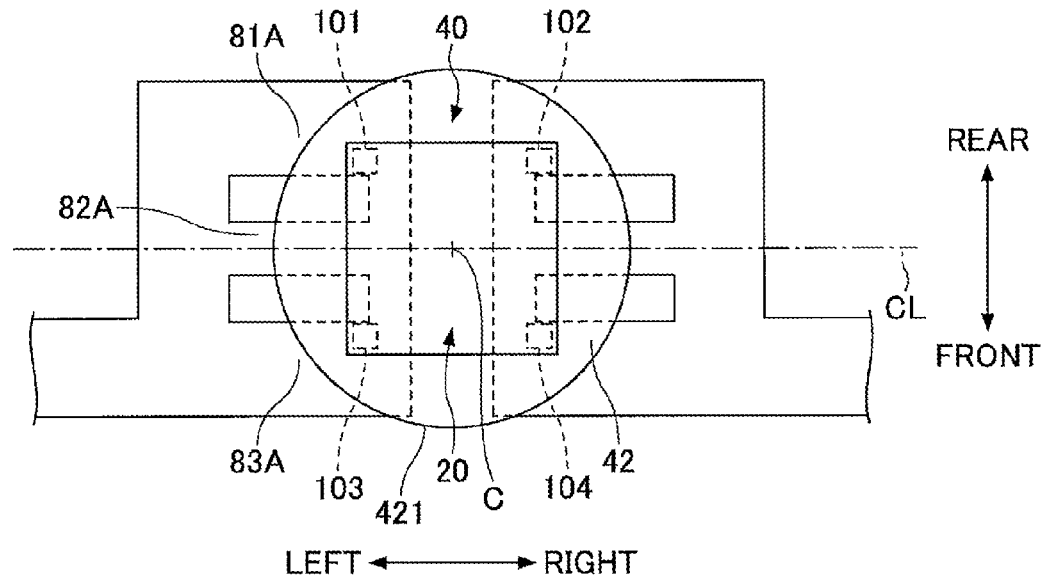
FIG. 24 is a diagram illustrating an example of a configuration that meets a condition for a triple-path.
Figure 25:
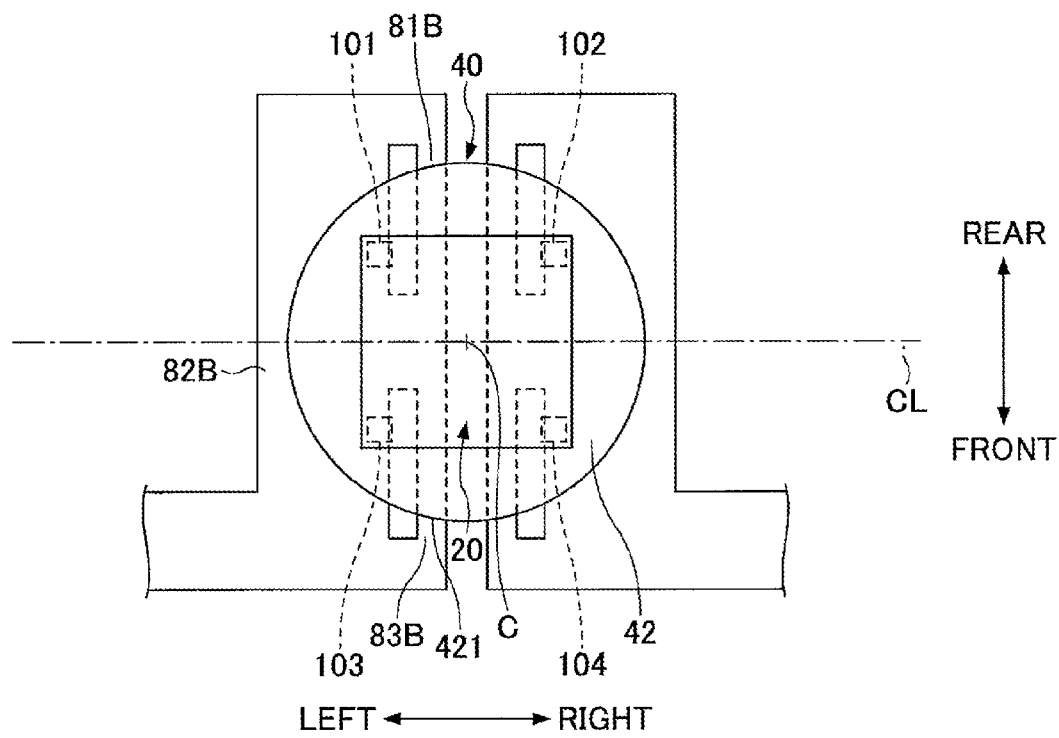
FIG. 25 is a diagram illustrating another example of a configuration that meets a condition for a triple-path.

Further, in order to implement the triple-path, it is also necessary, in addition to the condition element (referred to as "the first condition, hereinafter") that a3 is greater than c1, that any one of the following second condition element and the third condition element is met. Second condition element: b1 is smaller than a1 Third condition element: b2 is smaller than a2 This is because, if none of the second and third condition elements is met, as illustrated in FIG. 23, for example, the triple-path cannot be implemented. On the other hand, if only the second condition element of the second and third condition elements is met, as illustrated in FIG. 24, for example, the triple-path (the first path 81A, the second path 82A, and the third path 83A, with respect to the antenna wiring on the left side) can be implemented. Similarly, if only the third condition element of the second and third condition elements is met, as illustrated in FIG. 25, for example, the triple-path (the first path 81B, the second path 82B, and the third path 83B, with respect to the antenna wiring on the left side) can be implemented. It is noted that, in the second embodiment described above and illustrated in FIG. 19, the second and third condition elements are met in addition to the first condition element being met.

It is noted that, here, as illustrated in FIG. 21, since the land portion 331 of the antenna wiring 33 and the land portion 341 of the antenna wiring 34 is symmetric with respect to the center of the IC chip 20, the collective condition for the antenna wirings 33 and 34 is explained. However, the same idea can be applied when the condition for the antenna wiring 33 and the condition for the antenna wiring 34 can be set separately.

For example, with respect to the antenna wiring 33, the first condition element "a3 being greater than c1" may be replaced with a condition element "a3' being greater than c1'". Here, a3' corresponds to the maximum distance between the land portion 331 and the center of the IC chip 20 in the left and right direction. c1' corresponds to the maximum distance between the filet edge 421, which is located on the left side with respect to the center of the IC chip 20, and the IC chip 20 in the left and right direction. The second condition element "b1 being smaller than a1" may be replaced with a condition element "b1/2 (b1 divided by 2) being smaller than a1'". Here, a1' corresponds to the maximum distance between the center of the IC chip 20 and the apertures 332 of the antenna wiring 33 in the left and right direction. Similarly, third condition element "b2 being smaller than a2" may be replaced with a condition element "b2/2 (b2 divided by 2) being smaller than a2'". Here, a2' corresponds to the maximum distance between the center of the IC chip 20 and the apertures 332 of the antenna wiring 33 in the front and rear direction.

It is noted that the idea described above can be applied to the double-path at the filet edge in the first embodiment described above.

Third Embodiment

Next, a third embodiment is described. The third embodiment differs from the first embodiment in that wirings extend in the front and rear direction from an IC chip 20-3, as described hereinafter. Elements that may be the same as those according to the first embodiment are given the same reference numbers in FIG. 26 and FIG. 27, and an explanation thereof is omitted.

Figure 26:
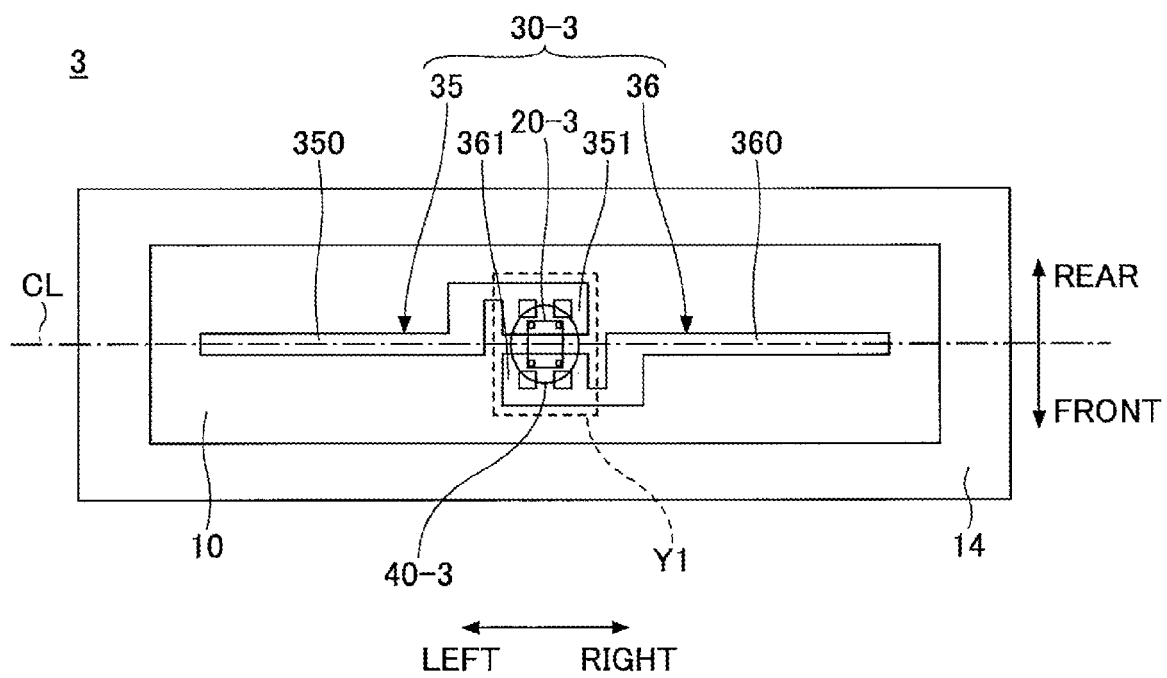
FIG. 26 is a top view schematically illustrating a configuration of an RFID tag according to a third embodiment.
Figure 27:
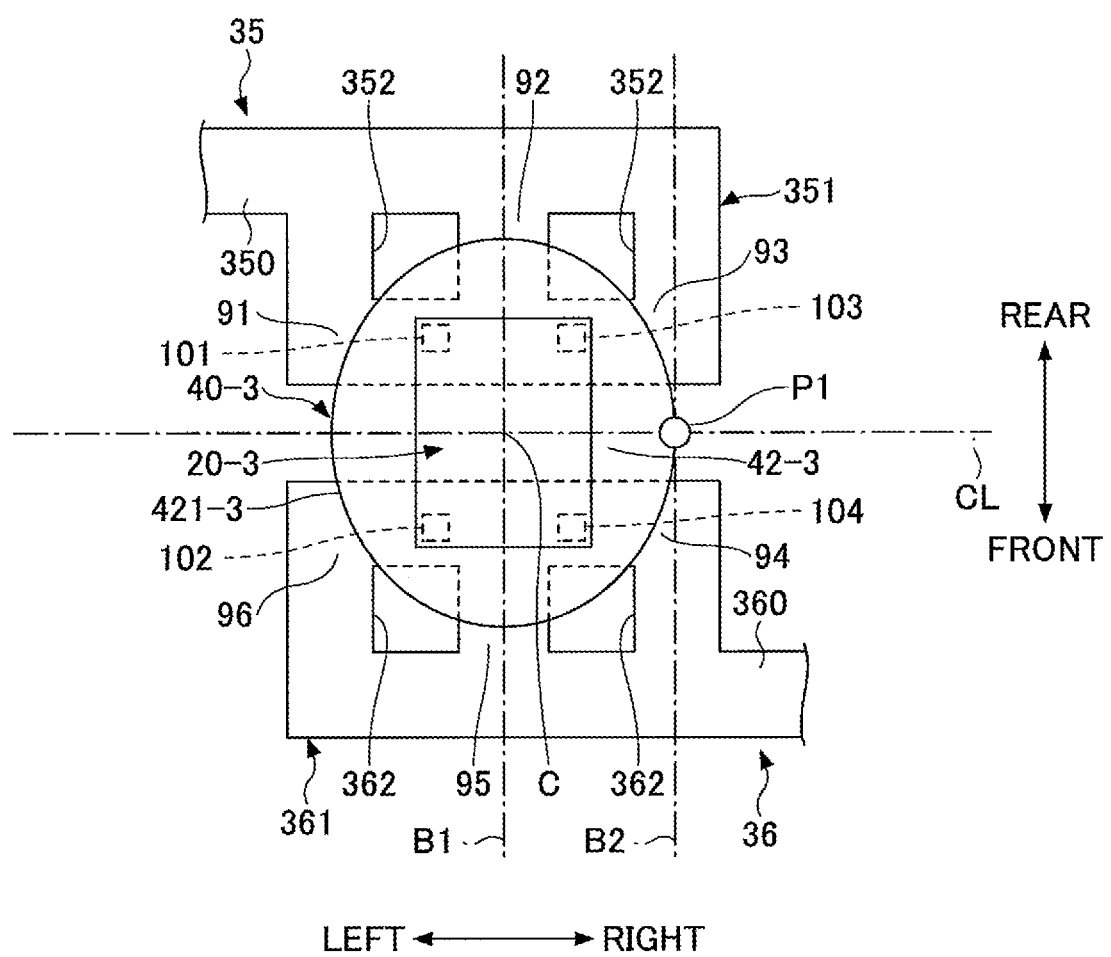
FIG. 27 is a magnified view of a portion Y1 in FIG. 26.

FIG. 26 is a top view schematically illustrating a configuration of an RFID tag according to a third embodiment. FIG. 27 is a magnified view of a portion Y1 in FIG. 26. In FIG. 26, an RFID tag 3 is illustrated transparently such that the inside of the RFID tag 3 can be seen. In FIG. 27, a portion located below the IC chip 20-3 or an adhesive layer 40-3 is illustrated with dotted lines. Further, in FIG. 27 an illustration of the substrate 10 is omitted. It is noted that the left and right direction, the front and rear direction, and the upper and lower direction are as defined above.

The RFID tag 3 differs from the RFID tag 1 according to the first embodiment described above in that the IC chip 20 is replaced with the IC chip 20-3, the antenna portion 30 is replaced with an antenna portion 30-3, and the adhesive layer 40 is replaced with the adhesive layer 40-3.

The IC chip 20-3 differs from the IC chip 20 according to the first embodiment described above in that the bump 101 and the bump 102 are disposed side by side in the front and rear direction, as illustrated in FIG. 27. Further, the IC chip 20-3 differs from the IC chip 20 according to the first embodiment, which has a square shape, in that the IC chip 20-3 has a rectangular shape, as illustrated in FIG. 27. The IC chip 20-3 is disposed in such an orientation that the longer sides of the rectangular extend in the front and rear direction.

The antenna portion 30-3 is formed in a form of a conducive pattern on the substrate 10. The antenna portion 30-3 has one end electrically coupled to the IC chip 20-3. The antenna portion 30-3 includes an antenna wiring 35 on a left side and an antenna wiring 36 on a right side. It is preferred that the antenna wirings 35 and 36 have the same length in the left and right direction.

The antenna wiring 35 includes an antenna body 350 and a land portion 351.

The antenna body 350 extends straight in the left and right direction with a predetermined width. It is noted that, in the example illustrated in FIG. 26, the antenna body 350 extends on the center line CL in the right direction from the left end, is bent in the rear direction at right angle before the IC chip 20-3, and is bent again in the left and right direction to couple to the land portion 351. However, the antenna body 350 may be coupled to the land portion 351 without being bent, or may be coupled to the land portion 331 in other ways, as long as the land portion 351 is formed on the rear side with respect to the IC chip 20-3 as illustrated in FIG. 26.

The land portion 351 is formed in an end of the antenna wiring 35 on the side of the bump 101. At the land portion 351, the antenna wiring 35 is electrically coupled to the IC chip 20-3 via the bump 101, as illustrated in FIG. 27. In the example illustrated in FIG. 27, the land portion 351 is formed on the rear side with respect to the center C of the IC chip 20-3. In this case, a portion of the land portion 351 on the front side with respect to an aperture 352 (described hereinafter) is formed at the position of the bump 101.

The antenna body 350 of the antenna wiring is electrically coupled to the bump 101 via a plurality of paths formed at a filet edge 421-3 of the adhesive layer 40-3. In the example illustrated in FIG. 27, there are three paths, that is to say, a first path 91, a second path 92 and a third path 93. The first path 91, the second path 92, and the third path 93 extend to the bump 101 below a filet portion 42-3, respectively, to join into one, as illustrated in FIG. 27. The first path 91, the second path 92, and the third path 93 are formed by two apertures 352 formed in the land portion 351, as illustrated in FIG. 27. The apertures 352 are formed in the land portion 351 such that the apertures 342 cross the filet edge 421-3, respectively. The apertures 352 are formed side by side in the left and right direction.

Similarly, the antenna wiring 36 includes an antenna body 360 and a land portion 361.

The antenna body 360 extends straight in the left and right direction with a predetermined width. It is noted that, in the example illustrated in FIG. 26, the antenna body 360 extends on the center line CL in the left direction from the right end, is bent in the front direction at right angle before the IC chip 20-3, and is bent again in the left and right direction to couple to the land portion 361. However, the antenna body 360 may be coupled to the land portion 361 without being bent, or may be coupled to the land portion 361 in other ways, as long as the land portion 361 is formed on the front side with respect to the IC chip 20-3 as illustrated in FIG. 26.

The land portion 361 is formed in an end of the antenna wiring 36 on the side of the bump 102. At the land portion 361, the antenna wiring 36 is electrically coupled to the IC chip 20-3 via the bump 102, as illustrated in FIG. 27. In the example illustrated in FIG. 27, a portion of the land portion 361 on the rear side with respect to an aperture 362 (described hereinafter) is formed at the position of the bump 102.

The antenna body 360 of the antenna wiring is electrically coupled to the bump 102 via a plurality of paths formed at a filet edge 421-3 of the adhesive layer 40-3. In the example illustrated in FIG. 27, there are three paths, that is to say, a fourth path 94, a fifth path 95 and a sixth path 96. The fourth path 94, the fifth path 95 and the sixth path 96 extend to the bump 102 below a filet portion 42-3, respectively, to join into one, as illustrated in FIG. 27. The fourth path 94, the fifth path 95, and the sixth path 96 are formed by two apertures 362 formed in the land portion 361, as illustrated in FIG. 27. The apertures 362 are formed in the land portion 361 such that the apertures 362 cross the filet edge 421-3, respectively. The apertures 362 are formed side by side in the left and right direction.

The adhesive layer 40-3 includes a base portion 41 (see FIG. 4) and a filet portion 42-3. Further, the filet portion 42-3 differs from the filet portion 42 according to the first embodiment, which has a circle shape, in that the filet portion 42-3 has an oval shape, as illustrated in FIG. 27. The filet portion 42-3 is disposed in such an orientation that the longer axis of the oval shape extend in the front and rear direction. It is noted that such an oval shape of the filet portion 42-3 is due to the rectangular shape of the IC chip 20-3. Accordingly, the filet edge 421-3 has a similar oval shape.

Also, according to the third embodiment, as is the case with the second embodiment described above, the triple-path at the filet edge 421-3 is implemented, which can decrease the probability that the RFID tag 3 falls in the disabled state for the communication, in comparison with the first embodiment in which the double-path at the filet edge 421 is implemented.

Here, as described above, the RFID tag 3 is flexible, and its bending deformation may occur with an increased frequency. The RFID tag 3 has a rectangular shape as illustrated in FIG. 26, and thus, in general, the RFID tag 3 is deformed mainly in a mode in which the longer sides are bent. For example, when the substrate 10 is bent in such a mode in which the left end and the right end come closer to each other, the stress may be concentrated at the central portion of the substrate 10 in the left and right direction. However, the IC chip 20-3 is disposed at the center of the substrate 10 in the left and right direction, and thus the substrate 10 is not easily bent in the region where the IC chip 20-3 is installed due to the stiffness of the IC chip 20-3. In other words, the bending deformation along the line B1 illustrated in FIG. 27 does not occur easily. For this reason, the points where the stress becomes maximum are outside of the region where the IC chip 20-3 is installed in the left and right direction. There is the filet portion 42-3 outside of the region where the IC chip 20-3 is installed, but the filet portion 42-3 also has stiffness, and thus the substrate 10 is not easily bent at the region where the filet portion 42-3 is formed. As a result of this, the stress becomes maximum at outermost positions of the filet edge 421-3 in the left and right direction (long-side direction). For example, the bending deformation along the line B2 illustrated in FIG. 27 may occur easily, which causes the stress to become maximum at the rightmost position P1 (i.e., the center position in the front and rear direction) of the filet edge 421-3. In this way, in the case of the configuration in which the filet portion 42-3 (the same holds true for the filet portion 42 in the first and second embodiments) is provided, the stress tends to become the maximum at the outermost positions of the filet edge 421-3 in the left and right direction (long-side direction). In the following, the outermost position of the filet edge 421-3 in the left and right direction (long-side direction) is also referred to as "the outermost positions of the filet edge 421-3".

According to the third embodiment, the antenna wirings 35 and 36 are not formed at the positions where the stress tends to become maximum, that is to say, the outermost positions of the filet edge 421-3, as illustrated in FIG. 27. With this arrangement, it becomes possible to protect the antenna wirings 35 and 36 against the bending deformation in the mode in which the longer sides are bent, which further increases the effects described above. As a result of this, the durability is further increased even in severe circumstances where the bending deformation is easily occurs.

Further, according to the third embodiment, the wirings from the IC chip 20-3 extends in the front and rear direction. Specifically, the land portion 351 is disposed on the rear side with respect to the IC chip 20-3, and the land portion 352 is disposed on the front side with respect to the IC chip 20-3. With this arrangement, it becomes possible to implement the triple-path at the filet edge 421-3, and make it easier not to form the antenna wirings 35 and 36 (the respective paths related to the multi-path at the filet edge) at the outermost positions of the filet edge 421-3.

Further, according to the third embodiment, the IC chip 20-3 has a rectangular shape, and is disposed such that the longer sides of the IC chip 20-3 extend in the front and rear direction. With this arrangement, it becomes possible to increase distances from the antenna wirings 35 and 36 to the outermost positions of the filet edge 421-3 in the front and rear direction in comparison with the case where the IC chip 20-3 is disposed in other orientations. The probability of the break of the antenna wirings 35 and 36 can be decreased as the distances from the antenna wirings 35 and 36 to the outermost positions of the filet edge 421-3 becomes greater. However, IC chip 20-3 may be disposed in other orientations, and may have a square shape.

Figure 28:
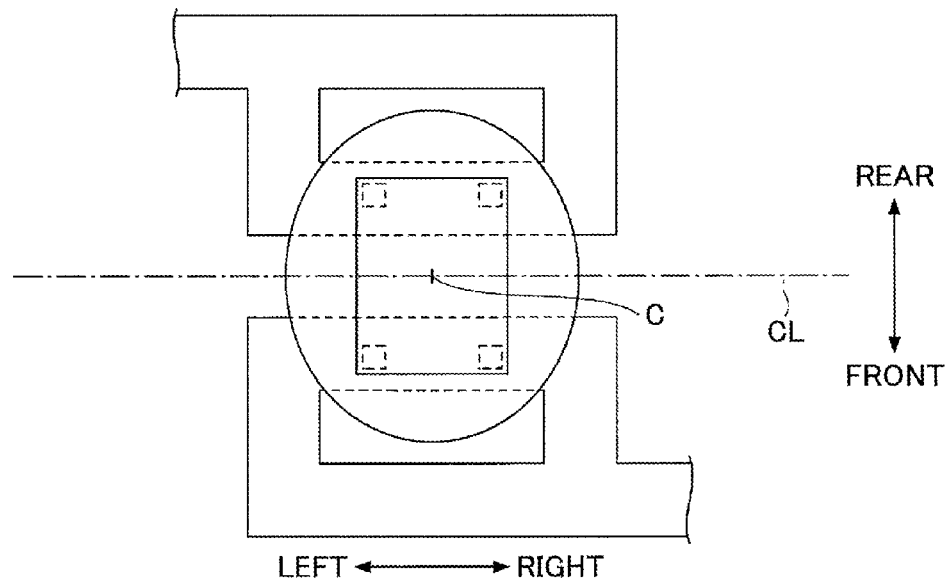
FIG. 28 is a diagram illustrating an alternative example.

It is noted that the third embodiment is applied to the configuration in which the triple-path at the filet edge 421-3 is implemented, as described above; however, the third embodiment can be applied to a configuration in which the double-path at the filet edge 421-3 is implemented, as illustrated in FIG. 28. Alternatively, the third embodiment may be applied to other configurations in which multi-path at the filet edge 421-3 for four or more number of paths is implemented.

Fourth Embodiment

Next, a fourth embodiment is described. The fourth embodiment differs from the second embodiment in that the center of an IC chip 20-4 is not on the center of the substrate 10, as described hereinafter. Elements that may be the same as those according to the second embodiment are given the same reference numbers in FIG. 29 and FIG. 30, and an explanation thereof is omitted.

Figure 29:
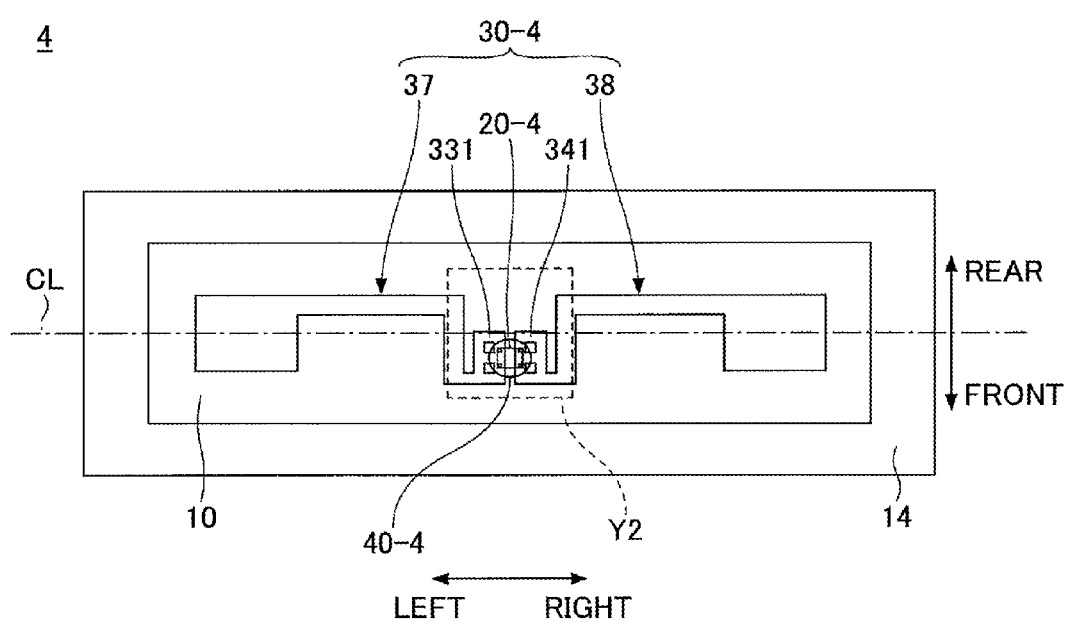
FIG. 29 is a top view schematically illustrating a configuration of an RFID tag according to a fourth embodiment.
Figure 30:
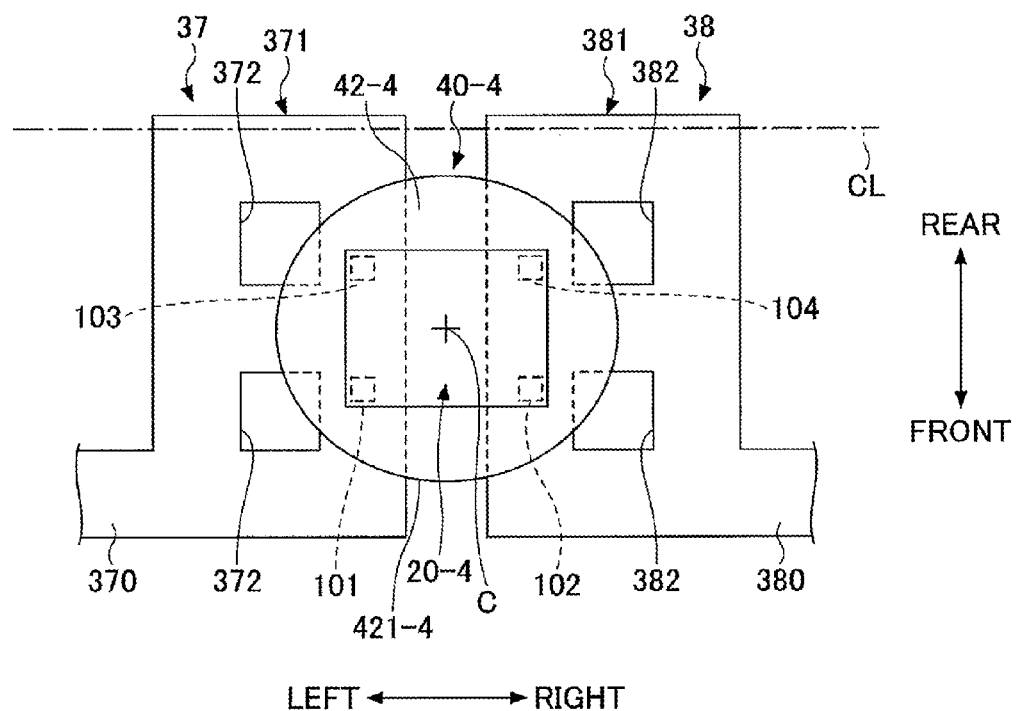
FIG. 30 is a magnified view of a portion Y2 in FIG. 29.

FIG. 29 is a top view schematically illustrating a configuration of an RFID tag according to the fourth embodiment. FIG. 30 is a magnified view of a portion Y2 in FIG. 29. In FIG. 29, an RFID tag 4 is illustrated transparently such that the inside of the RFID tag 4 can be seen. In FIG. 30, a portion located below the IC chip 20-4 or an adhesive layer 40-4 is illustrated with dotted lines. Further, in FIG. 30 an illustration of the substrate 10 is omitted. It is noted that the left and right direction, the front and rear direction, and the upper and lower direction are as defined above.

The RFID tag 4 differs from the RFID tag 2 according to the second embodiment described above in that the IC chip 20 is replaced with the IC chip 20-4, the antenna portion 30 is replaced with an antenna portion 30-4, and the adhesive layer 40 is replaced with the adhesive layer 40-4.

The IC chip 20-4 differs from the IC chip 20 according to the second embodiment described above in that the bump 101 and the bump 102 are disposed side by side in the left and right direction, as illustrated in FIG. 29. Further, the IC chip 20-4 differs from the IC chip 20 according to the second embodiment, which has a square shape, in that the IC chip 20-4 has a rectangular shape, as illustrated in FIG. 29. The IC chip 20-4 is disposed in such an orientation that the longer sides of the rectangular extend in the left and right direction.

The antenna wiring 37 includes an antenna body 370 and a land portion 371.

The antenna body 370 extends straight in the left and right direction with a predetermined width. It is noted that, in the example illustrated in FIG. 29, the antenna body 370 extends in the right direction from the left end and on the rear side with respect to the center line CL, is bent in the front direction at right angle before the IC chip 20-4 to cross the center line CL, and is bent again in the left and right direction to couple to the land portion 371.

The land portion 371 is formed in an end of the antenna wiring 37 on the side of the bump 101. At the land portion 371, the antenna wiring 37 is electrically coupled to the IC chip 20-4 via the bump 101, as illustrated in FIG. 30. In the example illustrated in FIG. 30, the land portion 371 is formed such that the center thereof is located on the front side with respect to the center line CL. Further, the land portion 371 is formed on the left side with respect to the center C of the IC chip 20-4. In this case, a portion of the land portion 371 on the right side with respect to apertures 372 (described hereinafter) is formed at the position of the bump 101.

The antenna body 370 of the antenna wiring is electrically coupled to the bump 101 via a plurality of paths formed at a filet edge 421-4 of the adhesive layer 40-4. The paths are formed by the apertures 372 formed in the land portion 371. The way of forming the paths is the same as that described with respect to the second embodiment described above, and thus a further explanation thereof is omitted.

Similarly, the antenna wiring 38 includes an antenna body 380 and a land portion 381.

The antenna body 380 extends straight in the left and right direction with a predetermined width. It is noted that, in the example illustrated in FIG. 29, the antenna body 380 extends in the left direction from the right end and on the rear side with respect to the center line CL, is bent in the front direction at right angle before the IC chip 20-4 to cross the center line CL, and is bent again in the left and right direction to couple to the land portion 381.

The land portion 381 is formed in an end of the antenna wiring 38 on the side of the bump 102. At the land portion 381, the antenna wiring 38 is electrically coupled to the IC chip 20-4 via the bump 102, as illustrated in FIG. 30. In the example illustrated in FIG. 30, the land portion 381 is formed such that the center thereof is located on the front side with respect to the center line CL. Further, the land portion 381 is formed on the right side with respect to the center C of the IC chip 20-4. In this case, a portion of the land portion 381 on the left side with respect to apertures 382 (described hereinafter) is formed at the position of the bump 102.

The antenna body 380 of the antenna wiring is electrically coupled to the bump 102 via a plurality of paths formed at a filet edge 421-4 of the adhesive layer 40-4. The paths are formed by the apertures 382 formed in the land portion 381. The way of forming the paths is the same as that described with respect to the second embodiment described above, and thus a further explanation thereof is omitted.

The adhesive layer 40-4 includes a base portion 41 (see FIG. 4) and a filet portion 42-4. Further, the filet portion 424 differs from the filet portion 42 according to the second embodiment, which has a circle shape, in that the filet portion 42-4 has an oval shape, as illustrated in FIG. 30. The filet portion 42-4 is disposed in such an orientation that the longer axis of the rectangular extend in the left and right direction. It is noted that such an oval shape of the filet portion 42-4 is due to the rectangular shape of the IC chip 20-4. Accordingly, the filet edge 421-4 has a similar oval shape.

According to the forth embodiment, as is the case with the second embodiment described above, the triple-path at the filet edge 421-4 is implemented. Accordingly, it becomes possible to decrease the probability that the RFID tag 4 falls in the disabled state for the communication, in comparison with the first embodiment in which the double-path at the filet edge 421 is implemented.

Figure 31:
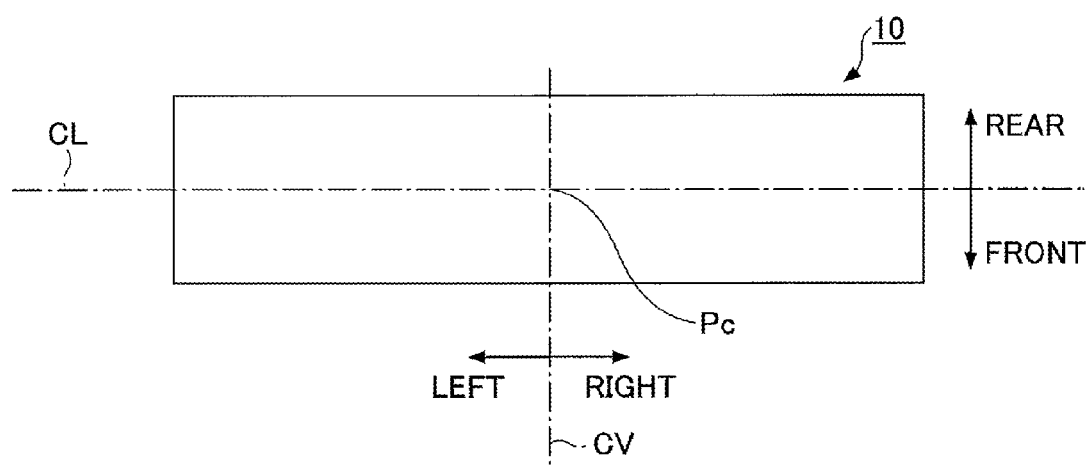
FIG. 31 is a diagram explaining a bending of a substrate.

Here, as described above, the RFID tag 4 is flexible, and its bending deformation may occur with increased frequency. The RFID tag 4 has a rectangular shape as illustrated in FIG. 31, and thus the RFID tag 3 is deformed mainly in a mode in which the longer sides are bent. Thus, when the substrate 10 is bent in such a mode in which the left end and the right end come closer to each other as well as in a such a mode in which the front end and the rear end come closer to each other, the stress becomes maximum at the center Pc of the substrate 10.

According to the fourth embodiment, as illustrated in FIG. 30, the IC chip 20-4 is offset in the front direction with respect to a position where the stress tends to become maximum, that is to say, the center Pc of the substrate 10, as illustrated in FIG. 30. With this arrangement, it becomes possible, for the respective sections of the filet edge 421-4 which the paths for the triple-path cross, to be offset in the front direction with respect to the center Pc of the substrate 10. As a result of this, it becomes possible to protect the antenna wirings 37 and 38 against the bending deformation in the mode in which the longer sides are bent as well as in the mode in which the shorter sides are bent, which further increases the effects described above. Therefore, the durability is further increased even in severe circumstances where the bending deformation is easily occurs in various modes.

It is noted that, in the fourth embodiment described above, the IC chip 20-4 is offset in the front direction with respect to the center Pc of the substrate 10; however, the IC chip 20-4 may be offset in the rear direction with respect to the center Pc of the substrate 10. Specifically, the configuration illustrated in FIG. 29 may be reversed symmetrically with respect the center line CL.

Further, the fourth embodiment is applied to the configuration in which the triple-path at the filet edge 421-4 is implemented, as described above; however, the fourth embodiment can be applied to the configuration in which the double-path at the filet edge 421-4 is implemented. Alternatively, the fourth embodiment may be applied to other configurations in which multi-path at the filet edge 421-4 for four or more number of paths is implemented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

What is claimed is:

1. An RFID tag, comprising:
   a substrate;
   a chip bonded to the substrate with an adhesive, and including a first connection terminal on a first surface, the first surface being on a side bonded to the substrate, wherein the first connection terminal is not a dummy terminal;
   a first antenna wiring formed on the substrate, and electrically coupled to only the first connection terminal; and
   an adhesive layer formed of the adhesive, and including a base portion and a filet portion, the base portion being in an area of the substrate opposed to the first surface of the chip, the filet portion being in an area of the substrate surrounding the chip, wherein
   the first antenna wiring is electrically coupled to the first connection terminal via a plurality of paths at an outer edge of the filet portion of the adhesive layer.

2. The RFID tag of claim 1, wherein the substrate is a flexible substrate.

3. The RFID tag of claim 1, wherein the filet portion has a height such the filet portion is bonded to a side surface of the chip.

4. The RFID tag of claim 1, wherein the paths are formed due to an aperture formed in a conductive pattern of the first antenna wiring.

5. The RFID tag of claim 1, wherein the paths are formed due to a slit formed in a conductive pattern of the first antenna wiring.

6. The RFID tag of claim 1, wherein a conductive pattern of the first antenna wiring includes two or more apertures at an end portion, the end portion being on a side coupled to the first connection terminal, and
   the apertures are formed such that the apertures cross the outer edge.

7. The RFID tag of claim 6, wherein the number of the paths is greater than the number of the apertures by 1.

8. The RFID tag of claim 1, further comprising a second antenna wiring formed on the substrate, and electrically coupled to a second connection terminal on the first surface of the chip, wherein
   the second antenna wiring is electrically coupled to the second connection terminal via a plurality of paths at the outer edge of the filet portion of the adhesive layer.

9. The RFID tag of claim 8, wherein the substrate has a long-side direction and a short-side direction,
   the first connection terminal is disposed on a first side in the short-side direction with respect to a center of the substrate,
   the second connection terminal is disposed on a second side in the short-side direction with respect to the center of the substrate,
   the paths related to the first antenna wiring are disposed on the first side in the short-side direction with respect to the center of the substrate, and
   the paths related to the second antenna wiring are disposed on the second side in the short-side direction with respect to the center of the substrate.

10. The RFID tag of claim 8, wherein the substrate has a long-side direction and a short-side direction,
    the first connection terminal is disposed on a first side in the long-side direction with respect to a center of the substrate,
    the second connection terminal is disposed on a second side in the long-side direction with respect to a center of the substrate,
    the paths related to the first antenna wiring are disposed on the first side in the long-side direction with respect to the center of the substrate, and
    the paths related to the second antenna wiring are disposed on the second side in the long-side direction with respect to the center of the substrate.

11. The RFID tag of claim 10, wherein the chip is offset in the short-side direction with respect to the center of the substrate.

12. The RFID tag of claim 8, wherein the paths related to the second antenna wiring and the paths related to the first antenna wiring are disposed symmetrically with respect to a center of the substrate, viewed in a direction perpendicular to the first surface.

* * * * *